(12) United States Patent
Kim et al.

(10) Patent No.: US 11,877,469 B2
(45) Date of Patent: Jan. 16, 2024

(54) DISPLAY DEVICE AND MANUFACTURING METHOD THEREOF

(71) Applicant: SAMSUNG DISPLAY CO., LTD., Yongin-si (KR)

(72) Inventors: Seung Kim, Seongnam-si (KR); Junehyoung Park, Seoul (KR); Jeongwoo Park, Yongin-si (KR); Wonsang Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 102 days.

(21) Appl. No.: 16/598,447

(22) Filed: Oct. 10, 2019

(65) Prior Publication Data

US 2020/0119302 A1    Apr. 16, 2020

(30) Foreign Application Priority Data

Oct. 12, 2018   (KR) .................... 10-2018-0121998

(51) Int. Cl.
*H10K 50/842*   (2023.01)
*H01L 33/52*   (2010.01)
(Continued)

(52) U.S. Cl.
CPC ......... *H10K 50/8428* (2023.02); *H01L 33/52* (2013.01); *H10K 50/844* (2023.02);
(Continued)

(58) Field of Classification Search
CPC ....... H01L 51/524–525; H01L 51/5253; H01L 51/56; H01L 27/3246; H01L 27/3295;
(Continued)

(56) References Cited

U.S. PATENT DOCUMENTS 8,350,467 B2   1/2013  Oh et al.
8,368,090 B2   2/2013  Lee
(Continued)

FOREIGN PATENT DOCUMENTS

CN         1812156 A      8/2006
KR      10-0144634 B1    7/1996
(Continued)

OTHER PUBLICATIONS

Korean Notice of Allowance dated Oct. 17, 2023, issued in corresponding Korean Patent Application No. 10-2018-0121998 (2 pages).

*Primary Examiner* — Kenneth Parker
*Assistant Examiner* — John Lin
(74) *Attorney, Agent, or Firm* — Lewis Roca Rothgerber Christie LLP

(57) ABSTRACT

A display device may include a display substrate, an encapsulation substrate, and a sealing member. The display substrate may include a pixel defining layer. The sealing member may include a first portion having an inner portion between the display substrate and the encapsulation substrate and overlapping an edge portion of the pixel defining layer and an outer portion extending from the inner portion and located outside the inner portion; and a second portion between the outer portion and the display substrate.

14 Claims, 18 Drawing Sheets

(51) Int. Cl.
*H10K 50/844* (2023.01)
*H10K 71/00* (2023.01)

(52) U.S. Cl.
CPC ..... *H10K 50/8423* (2023.02); *H10K 50/8426* (2023.02); *H10K 71/00* (2023.02)

(58) Field of Classification Search
CPC .............. H01L 51/5243; H01L 51/5246; H01L 51/5256; H10K 50/8428; H10K 50/8423; H10K 50/8426; H10K 50/844; H10K 71/00; H10K 59/122; H10K 59/8723; H10K 59/8721; H10K 59/8722; H10K 59/873; H10K 50/841; H10K 50/842; H10K 50/8445; H10K 59/871; H10K 59/872; H10K 59/8731; H10K 71/40; H10K 71/421; H10K 71/441

See application file for complete search history.

(56) References Cited

U.S. PATENT DOCUMENTS

| | | | |
|---|---|---|---|
| 8,410,685 B2 | 4/2013 | Ota | |
| 8,803,184 B2 | 8/2014 | Lee et al. | |
| 9,372,364 B2 | 6/2016 | Kim et al. | |
| 10,083,992 B2 | 9/2018 | Go et al. | |
| 2004/0160179 A1 | 8/2004 | Omura | |
| 2006/0125392 A1* | 6/2006 | Munekata | H10K 50/846 313/512 |
| 2007/0159094 A1* | 7/2007 | Oh | H10K 59/88 313/503 |
| 2007/0176549 A1* | 8/2007 | Park | C03C 8/02 313/512 |
| 2009/0230499 A1* | 9/2009 | Warsop | G01P 13/025 257/467 |
| 2011/0133637 A1* | 6/2011 | Ota | H10K 50/8426 313/504 |
| 2011/0303943 A1* | 12/2011 | Lee | H10K 50/8426 438/26 |
| 2013/0263491 A1* | 10/2013 | Jung | F41G 1/30 42/113 |
| 2015/0060893 A1* | 3/2015 | Cho | H10K 50/8428 438/26 |
| 2015/0218032 A1 | 8/2015 | Hogan et al. | |
| 2015/0255856 A1* | 9/2015 | Hong | H01Q 9/0407 343/702 |
| 2016/0086977 A1* | 3/2016 | Go | H10K 59/131 257/773 |
| 2016/0096768 A1 | 4/2016 | Takao et al. | |
| 2017/0077192 A1* | 3/2017 | Jang | H01L 27/1222 |
| 2017/0090227 A1 | 3/2017 | Yun et al. | |
| 2019/0326549 A1* | 10/2019 | Kokame | H01L 51/5246 |

FOREIGN PATENT DOCUMENTS

| | | |
|---|---|---|
| KR | 10-385444 B1 | 5/2003 |
| KR | 10-2004-0105960 A | 12/2004 |
| KR | 10-0554610 B1 | 2/2006 |
| KR | 10-656192 B1 | 12/2006 |
| KR | 10-0688790 B1 | 3/2007 |
| KR | 10-0695169 | 3/2007 |
| KR | 10-2011-0043713 | 4/2011 |
| KR | 10-1587097 B1 | 4/2011 |
| KR | 10-2011-0135625 | 12/2011 |
| KR | 10-1135542 B1 | 4/2012 |
| KR | 2015-0026448 A | 3/2015 |
| KR | 10-2015-0042985 A | 4/2015 |
| KR | 10-2016-0035712 | 4/2016 |
| KR | 10-1625560 B1 | 5/2016 |
| KR | 2016-0053842 A | 5/2016 |
| KR | 2016-0118267 A | 10/2016 |
| KR | 10-1687966 B1 | 12/2016 |
| WO | WO 2018/128033 A1 | 7/2018 |

* cited by examiner

DISPLAY DEVICE AND MANUFACTURING METHOD THEREOF

CROSS-REFERENCE TO RELATED APPLICATION

This application claims priority to and the benefit of Korean Patent Application No. 10-2018-0121998, filed on Oct. 12, 2018 in the Korean Intellectual Property Office, the entire content of which is hereby incorporated by reference.

BACKGROUND

1. Field

Aspects of embodiments of the present disclosure relate to a display device and a manufacturing method thereof.

2. Description of the Related Art

Various display devices used in multimedia devices, such as televisions, mobile phones, tablet computers, navigation units, and game consoles, have been developed.

In particular, research for increasing durability of the display device and reducing an area of a non-display area of the display device has progressed.

A sealing member is used to attach the display substrate and the encapsulation substrate of the display device. While the display device is used, damage may be generated when an impact, such as falling, is applied to the display device. When an attachment width of the sealing member increases to improve an adhesive property, the area of the non-display area undesirably increases.

SUMMARY

According to aspects of embodiments of the present disclosure, a display device has a structure for preventing or reducing damage due to an external impact, and a manufacturing method thereof is provided.

According to further aspects of embodiments of the present disclosure, a display device has a reduced area of a non-display area, and a manufacturing method thereof is provided.

According to one or more embodiments, a display device includes a display substrate, an encapsulation substrate, and a sealing member.

In an embodiment, the display substrate may include a base substrate, a circuit layer, light emitting elements, and a pixel defining layer.

In an embodiment, the base substrate may have a display area and a non-display area, the circuit layer may be on the base substrate, the light emitting elements may be on the circuit layer and overlap the display area, and the pixel defining layer may be on the circuit layer and define openings corresponding to the light emitting elements.

In an embodiment, the encapsulation substrate may be over the display substrate, and the sealing member may couple the display substrate and the encapsulation substrate, and the pixel defining layer may include an edge portion overlapping the non-display area and a central portion overlapping the display area.

In an embodiment, the sealing member may include: a first portion having an inner portion disposed between the display substrate and the encapsulation substrate and overlapping the edge portion of the pixel defining layer and an outer portion extending from the inner portion and disposed outside the inner portion; and a second portion disposed between the outer portion and the display substrate.

In an embodiment, the first portion of the sealing member may have a thickness of about 0.5 µm or more and about 2 µm or less, and a sum of thicknesses of the first portion and the second portion of the sealing member may be about 2.5 µm or more and about 10 µm or less.

In an embodiment, the first portion and the second portion of the sealing member may be integrated with each other.

In an embodiment, the base substrate may be parallel to a plane defined by a first direction and a second direction crossing the first direction, and the first portion may have a width greater than that of the second portion on the plane. The first portion and the second portion may define an interface. The first portion may include at least one of an alkali metal atom and an alkali metal positive ion. A difference between thermal expansion coefficients of the first portion and the encapsulation substrate may be about 5% or less. The second portion may include a material having an elastic modulus less than that of a material of the first portion.

In an embodiment, the sealing member may be directly disposed on a bottom surface of the encapsulation substrate, and a pattern may be defined in a contact area of the bottom surface of the encapsulation substrate which contacts the sealing member.

In an embodiment, the display device may further include a coating layer directly disposed on a bottom surface of the encapsulation substrate. The coating layer may include a first coating portion overlapping the non-display area and a second coating portion overlapping the display area, and the second coating portion overlapping the display area may have a light transmittance of about 90% or more. The coating layer may include at least one of silicon oxide, nitric oxide, metal, and metallic oxide.

In an embodiment, the first portion of the sealing member may contact a bottom surface of the coating layer, and a pattern may be defined in a contact area of the bottom surface of the coating layer which contacts the sealing member.

In an embodiment, a sum of a thickness of the first portion of the sealing member and a thickness of the coating layer contacting the first portion may be about 0.5 µm or more and about 2 µm or less, and a sum of thicknesses of the first portion, the second portion, and the coating layer may be about 3 µm or more and about 10 µm or less.

In an embodiment, the encapsulation substrate may include glass. A contact surface between the first portion and the encapsulation substrate may have a width of about 300 µm or more and about 700 µm or less.

According to one or more embodiments of the inventive concept, a display device includes a display substrate, an encapsulation substrate, and a sealing member.

In an embodiment, the display substrate may include a base substrate, a voltage supply electrode, a light emitting element, and an organic spacer.

In an embodiment, the base substrate may include a display area and a non-display area, the voltage supply electrode may be on the non-display area, the light emitting element may be electrically connected to the voltage supply electrode and located on the display area, and the organic spacer may overlap the voltage supply electrode.

In an embodiment, the encapsulation substrate may be on the display substrate, and a sealing member may couple the display substrate and the encapsulation substrate. The sealing member may include: a first portion between the display substrate and the encapsulation substrate and including a side surface that overlaps the organic spacer and is aligned with a side surface of the display substrate; and a second portion between the first portion and the display substrate and including a side surface aligned with the side surface of the display substrate.

According to one or more embodiments of the inventive concept, a method of manufacturing a display device includes: providing an encapsulation substrate; providing a display substrate; forming a first preliminary sealing member; forming a second preliminary sealing member; firing; aligning; and sealing.

In an embodiment, the providing of the display substrate may include providing a display substrate including a base substrate including a display area and a non-display area, a circuit layer on the base substrate, light emitting elements on the circuit layer and overlapping the display area, and a pixel defining layer on the circuit layer and in which openings corresponding to the light emitting elements are defined.

In an embodiment, the forming of the first preliminary sealing member may include forming a first preliminary sealing member on the encapsulation substrate.

In an embodiment, the forming of the second preliminary sealing member may include forming a second preliminary sealing member, which partially overlaps the first preliminary sealing member, on the first preliminary sealing member.

In an embodiment, the firing may include firing the first preliminary sealing member and the second preliminary sealing member.

In an embodiment, the aligning may include aligning the encapsulation substrate with the display substrate such that the first preliminary sealing member and the second preliminary sealing member do not overlap the display area.

In an embodiment, the sealing may include sealing the first preliminary sealing member and the second preliminary sealing member.

In an embodiment, the sealing of the first preliminary sealing member and the second preliminary sealing member may include heating the first preliminary sealing member and the second preliminary sealing member at a temperature of about 350° C. or more and about 600° C. or less by irradiating a laser beam.

In an embodiment, the method may further include forming a coating layer and forming a pattern. The forming of the coating layer may include forming a coating layer on a surface of the encapsulation substrate, and the forming of the pattern may include forming a pattern in an area of the coating layer on which the first preliminary sealing member is located.

BRIEF DESCRIPTION OF THE FIGURES

The accompanying drawings are included to provide a further understanding of the inventive concept, and are incorporated in and constitute a part of this specification. The drawings illustrate some example embodiments of the inventive concept and, together with the description, serve to explain principles of the inventive concept. In the drawings.

DETAILED DESCRIPTION

Figure 1:
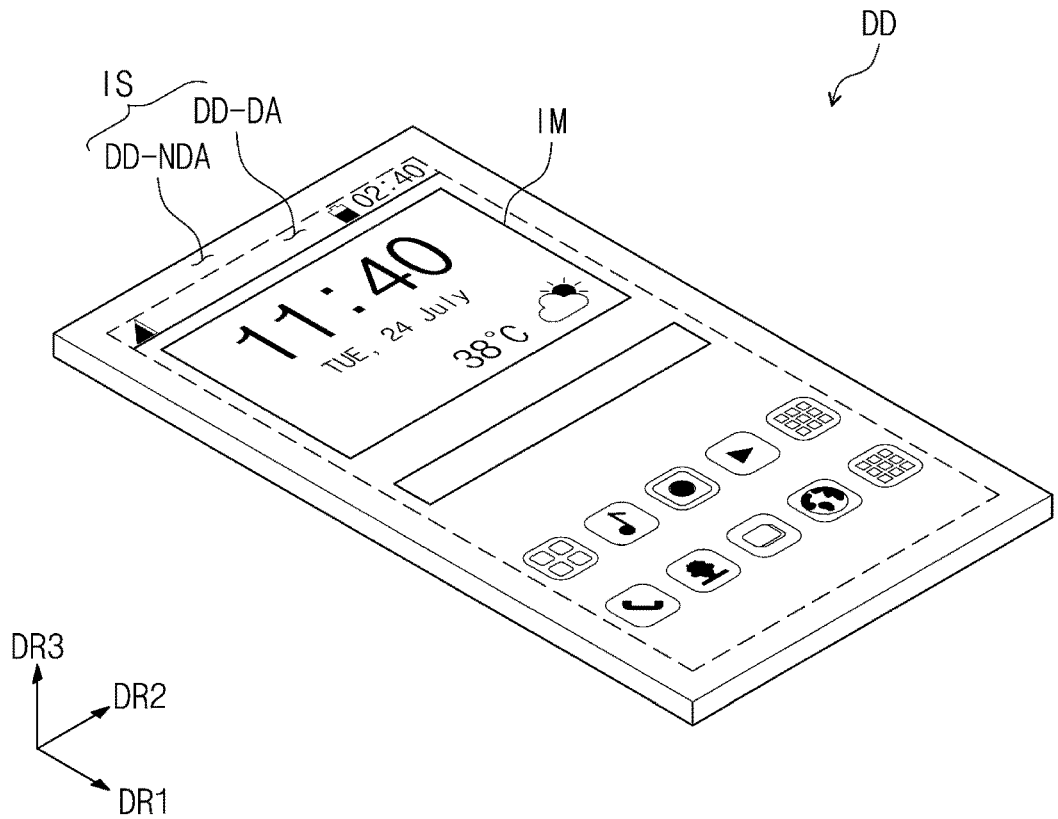
FIG. 1 is a perspective view illustrating a display device according to an embodiment of the inventive concept.

Herein, some embodiments of the inventive concept will be described with reference to the accompanying drawings.

Also, in the figures, the thickness, ratio, and dimensions of components may be exaggerated for clarity of illustration. The term "and/or" includes any and all combinations of one or more of the associated listed items.

The meaning of "include" or "comprise" specifies a property, a fixed number, a step, an operation, an element, a component, or a combination thereof, but does not exclude other properties, fixed numbers, steps, operations, elements, components, or combinations thereof.

In this specification, an expression of "a component B is directly disposed on a component A" represents that a separate adhesive layer and/or adhesive member is not present between the component A and the component B. That is, an expression of "directly disposed" represents "contact."

A front surface (or top surface) and a rear surface (or bottom surface) of each of members is distinguished by a third directional axis DR3. However, in the embodiment, first to third directional axes DR1, DR2, and DR3 are exemplarily illustrated. Directions indicated by the first to third directional axes DR1, DR2, and DR3 may be a relative concept, and converted with respect to each other. Herein, the first to third directions may be directions indicated by the first to third directional axes DR1, DR2, and DR3 and designated by the same reference numerals, respectively.

Where an element is described as being related to another element, such as being "on" another element or "located on" a different element or a layer, this includes both a case in which an element is located directly on another element or a layer and a case in which an element is located on another element or layer via another layer or still another element. In contrast, where an element is described as being related to another element, such as being "directly on" another element or "located directly on" a different element or a layer, this indicates a case in which an element is located on another element or a layer with no intervening element or layer therebetween.

Throughout the specification, the same reference numerals are used for the same or similar parts.

It is to be understood that, although the terms "first," "second," etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It is to be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein are interpreted accordingly.

The terminology used herein is for the purpose of describing particular embodiments and is not intended to be limiting of example embodiments. As used herein, the singular forms "a," "an," and "the" are intended to include the plural forms as well, unless the context clearly indicates otherwise.

Unless otherwise defined, all terms (including technical and scientific terms) used herein have the same meaning as commonly understood by one of ordinary skill in the art to which example embodiments of the inventive concept belong. It is to be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a perspective view illustrating a display device DD according to an embodiment of the inventive concept.

Although the display device DD having a flat display surface is illustrated in an embodiment of the inventive concept, embodiments of the inventive concept are not limited thereto. For example, the display device DD may include a curved display surface or a three-dimensional display surface. The three-dimensional display surface may include a plurality of display areas indicating different directions from each other, such as, e.g., a polygonal column type display surface.

The display device DD according to an embodiment may be a rigid display device. However, embodiments of the inventive concept are not limited thereto. For example, the display device DD according to an embodiment of the inventive concept may be a flexible display device DD. The display device DD according to an embodiment of the inventive concept may be used for large-sized electronic devices, such as televisions and monitors, and small and medium-sized electronic devices, such as mobile phones, tablet PCs, navigation units for vehicles, game consoles, and smart watches.

A display area DD-DA and a non-display area DD-NDA surrounding the display area DD-DA may be defined in an image surface IS of the display device DD. The display area DD-DA may be defined as an area for displaying an image IM.

The display area DD-DA displays the image IM through a front surface thereof. FIG. 1 illustrates icon images as an example of the image IM.

Figure 2:
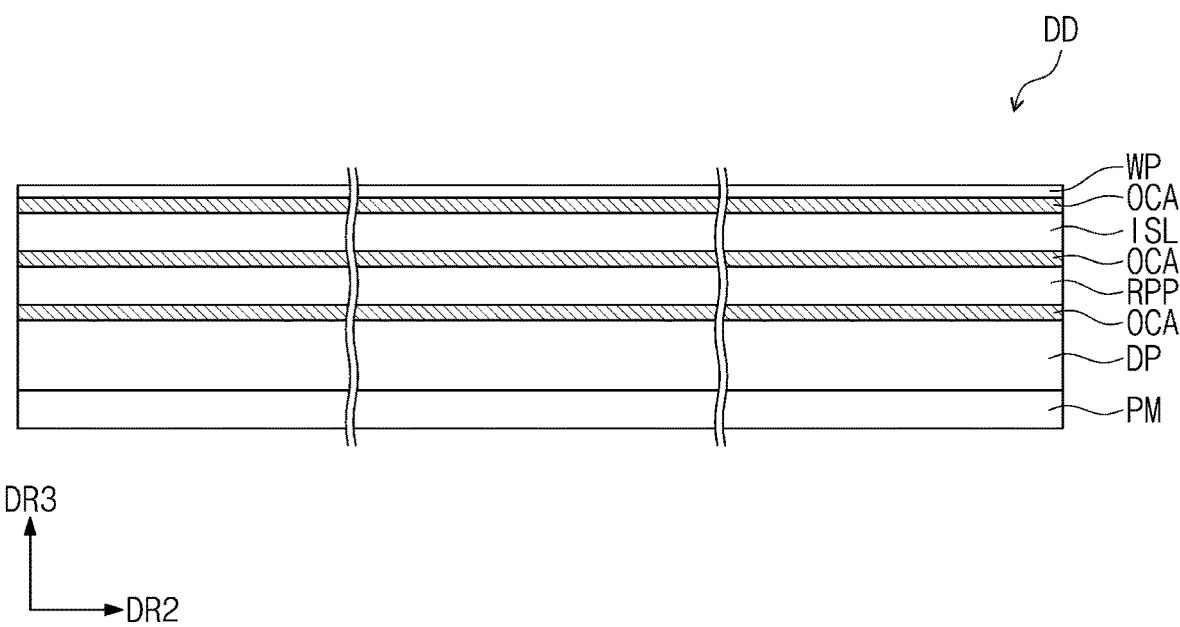
FIG. 2 is a cross-sectional view illustrating the display device according to an embodiment of the inventive concept.

FIG. 2 is a cross-sectional view illustrating the display device DD according to an embodiment of the inventive concept.

FIG. 2 is simply illustrated for explaining a lamination relationship between a functional panel and/or functional units of the display device DD.

As illustrated in FIG. 2, the display device DD may include a display panel DP, a reflection preventing member RPP, an input sensing unit ISL, a window member WP, and a protection film PM.

The reflection preventing member RPP may be disposed on the display panel DP, the input sensing unit ISL may be disposed on the reflection preventing member RPP, and the window member WP may be disposed on the input sensing unit ISL. The protection film PM may be disposed below the display panel DP.

An optically clear adhesive member OCA may be disposed between the display panel DP and the reflection preventing member RPP, between the reflection preventing member RPP and the input sensing unit ISL, and between the input sensing unit ISL and the window member WP.

The display panel DP generates an image, and the input sensing unit ISL acquires coordinate information of an external input (e.g., a touch event).

The display panel DP according to an embodiment of the inventive concept may be a light emitting display panel. However, embodiments of the inventive concept are not limited thereto. For example, the display panel DP may be an organic light emitting display panel and a quantum-dot light emitting display panel. The organic light emitting display panel may include a light emitting layer containing an organic light emitting material. The quantum-dot light emitting display panel may include a light emitting layer containing a quantum dot or a quantum rod. Herein, the display panel DP will be described as the organic light emitting display panel.

The reflection preventing member RPP may decrease a reflectance of external light incident from above the window member WP.

The input sensing unit ISL according to an embodiment of the inventive concept may detect an external input by detecting variation in capacitance caused by an external object. This may be referred to as a capacitive input sensing unit ISL.

Also, the input sensing unit ISL according to another embodiment of the inventive concept may detect an external input by detecting variation in pressure caused by an external object. This may be referred to as a pressure sensitive input sensing unit ISL.

Figure 5:
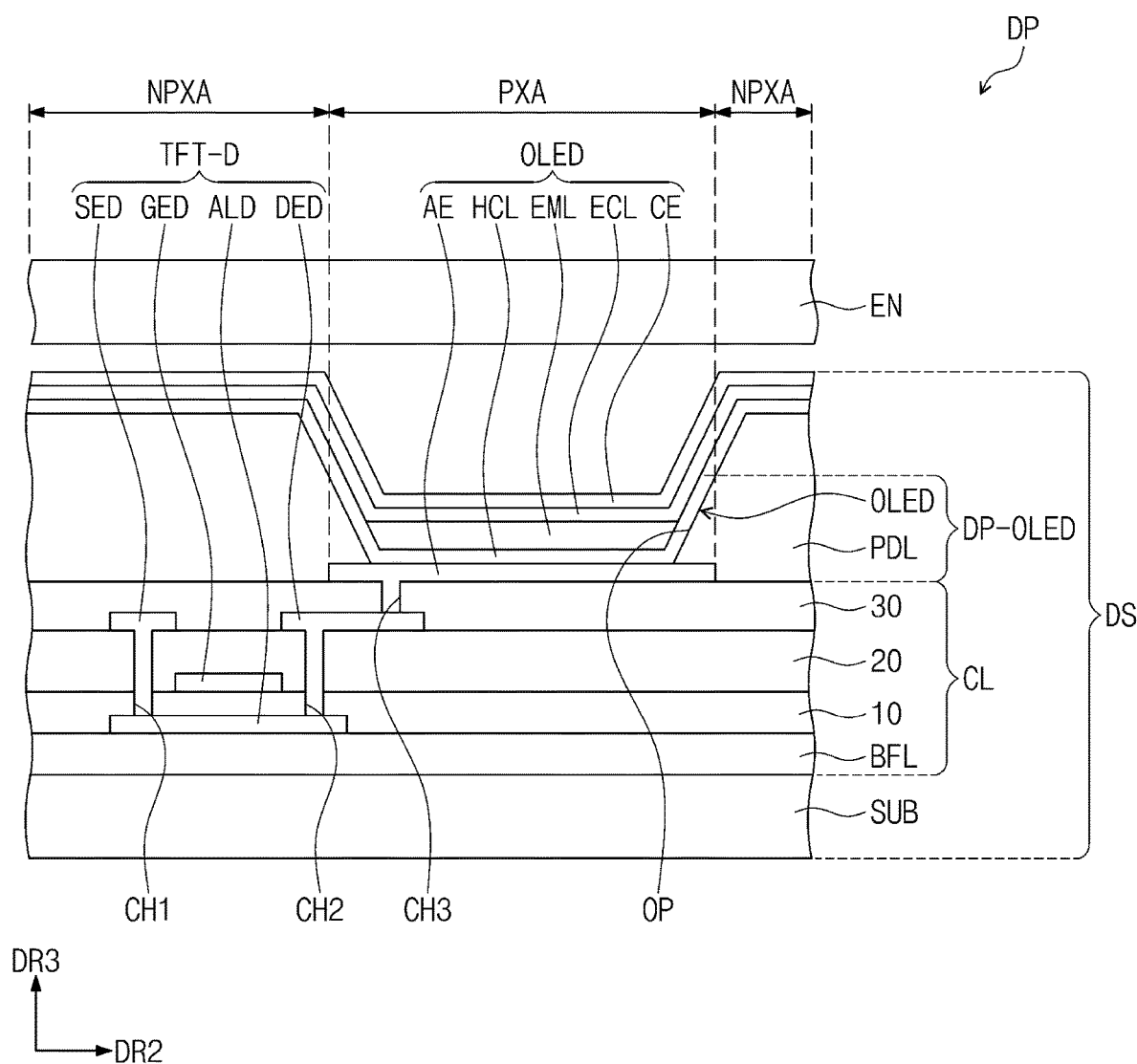
FIG. 5 is a cross-sectional view illustrating the pixel according to an embodiment of the inventive concept.

Although not shown, in an embodiment, a lamination sequence between the input sensing unit ISL and the reflection preventing member RPP may be changed, and the input sensing unit ISL may be directly disposed on an encapsulation substrate EN of the display panel DP (refer to FIG. 5). That is, the input sensing unit ISL may be provided on a base surface provided by the encapsulation substrate EN through a continuous process. However, embodiments of the inventive concept are not limited thereto. For example, the input sensing unit ISL may be variously provided.

The window member WP may protect the display device DD against an external impact and provide an input surface to a user. The window member WP may contain glass or plastic. The window member WP has a transparent property such that light generated from the display panel DP is transmitted therethrough.

The protection film PM protects the display panel DP. The protection film PM prevents or substantially prevents external moisture from being permeated into the display panel DP and absorbs an external impact.

A plastic resin may be used as a material of the protection film PM. However, embodiments of the inventive concept are not limited thereto. For example, the material of the protection film PM may include an organic/inorganic composite material.

Figure 3:
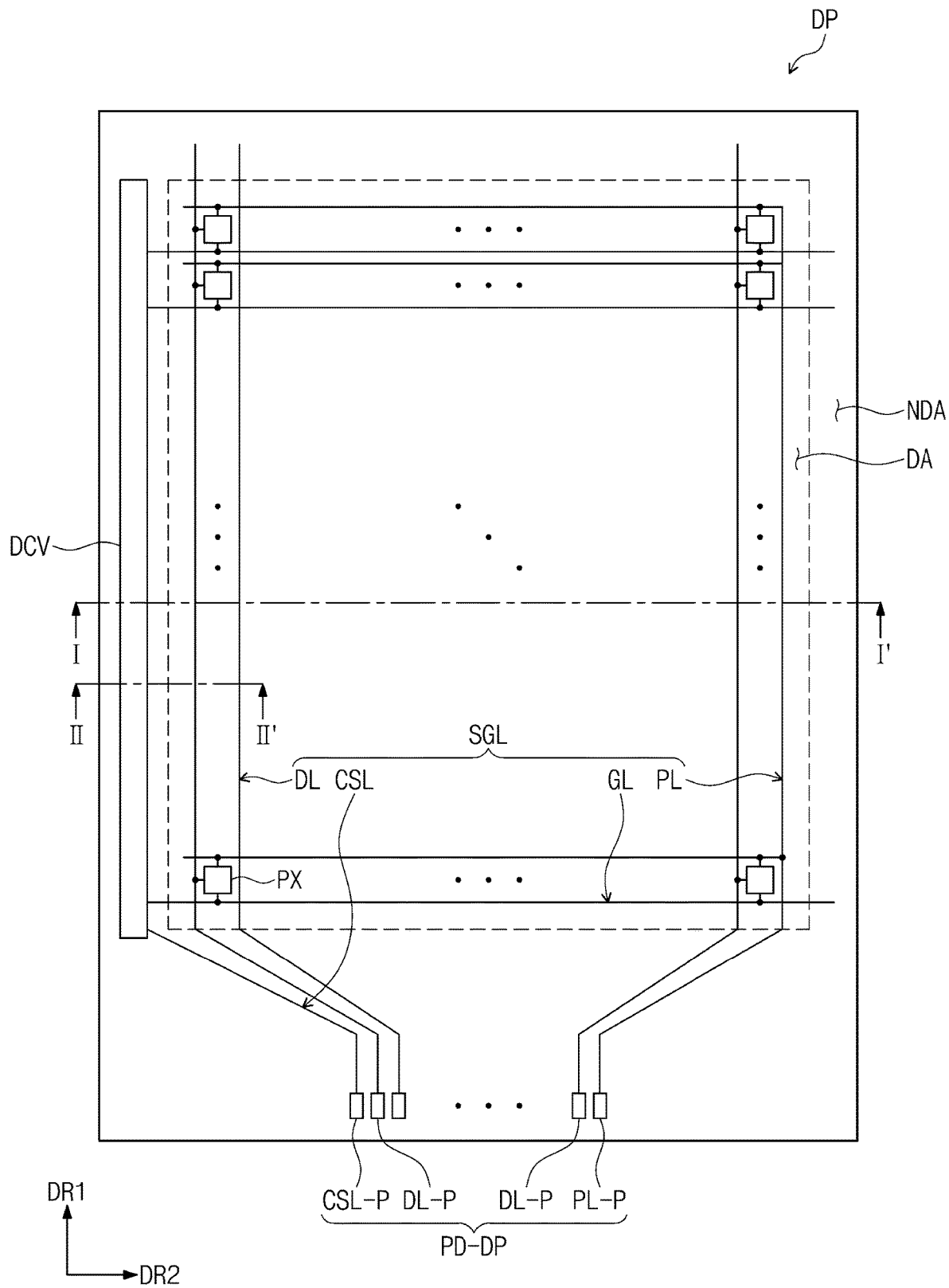
FIG. 3 is a plan view illustrating a display panel according to an embodiment of the inventive concept.
Figure 4:
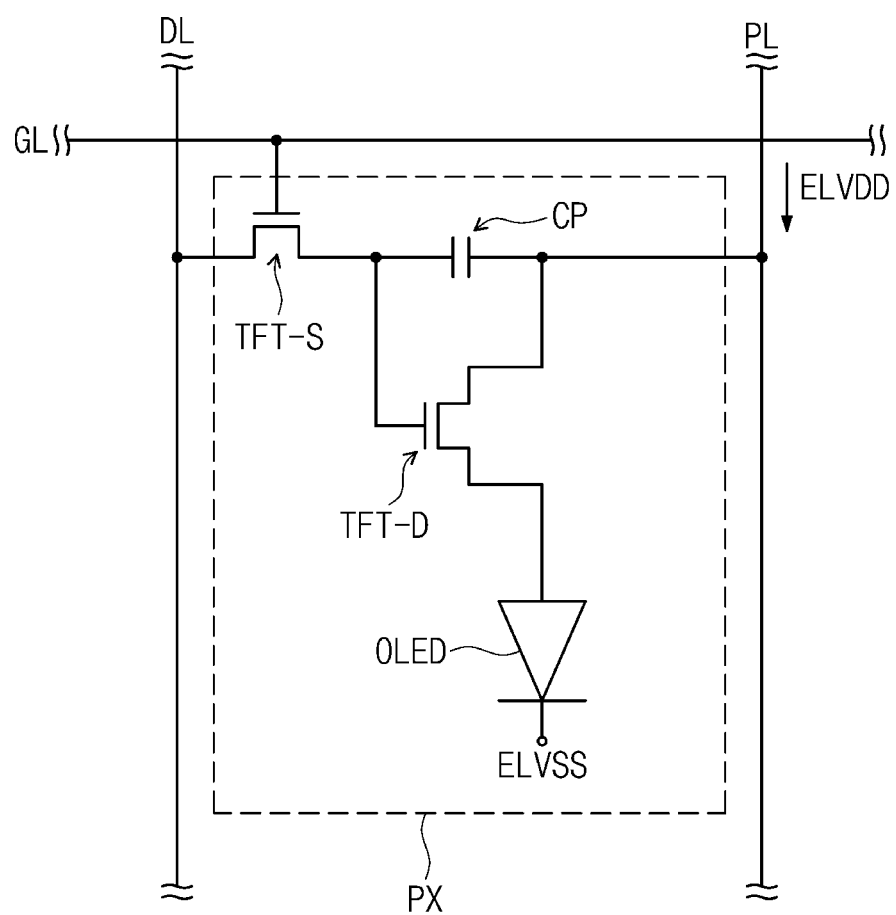
FIG. 4 is an equivalent circuit diagram illustrating a pixel according to an embodiment of the inventive concept.

FIG. 3 is a plan view illustrating the display panel DP according to an embodiment of the inventive concept; and FIG. 4 is an equivalent circuit diagram illustrating a pixel PX according to an embodiment of the inventive concept.

Referring to FIG. 3, the display panel DP includes a display area DA and a non-display area NDA on a plane. In an embodiment, the display area DA and the non-display area NDA of the display panel DP may correspond to the display area DD-DA (refer to FIG. 1) and the non-display area DD-NDA (refer to FIG. 1) of the display device DD (refer to FIG. 1), respectively. However, in an embodiment, the display area DA and the non-display area NDA of the display panel DP may not correspond to the display area DD-DA and the non-display area DD-NDA of the display device DD, respectively. For example, the display area DA and the non-display area NDA of the display panel DP may be changed according to a structure/design of the display panel DP.

The display panel DP may include a plurality of signal lines SGL and a plurality of pixels PX. An area on which the plurality of pixels PX is disposed is defined as the display area DA. In an embodiment, the non-display area NDA may be defined along an edge of the display area DA.

The plurality of signal lines SGL includes gate lines GL, data lines DL, a power line PL, and a control signal line CSL. The gate lines GL are connected to corresponding pixels PX of the plurality of pixels PX, respectively, and the data lines DL are connected to corresponding pixels PX of the plurality of pixels PX, respectively. The power line PL is connected to the plurality of pixels PX. A gate driving circuit DCV connected to the gate lines GL may be disposed on a side of the non-display area NDA. The control signal line CSL may provide control signals to the gate driving circuit DCV.

In an embodiment, some of the gate lines GL, the data lines DL, the power line PL, and the control signal line CSL may be disposed on a same layer, and some thereof may be disposed on different layers from each other.

Each of the gate lines GL, the data lines DL, the power line PL, and the control signal line CSL may include a signal line part and a display panel pad PD-DP connected to an end of the signal line part. The signal line part may be defined as a portion except for the display panel pad PD-DP of each of the gate lines GL, the data lines DL, the power line PL, and the control signal line CSL.

In an embodiment, the display panel pads PD-DP may be provided through a same process as transistors for driving the pixels PX. For example, the display panel pads PD-DP and the transistors for driving the pixels PX may be formed through the same process, such as a low temperature polycrystalline silicon (LTPS) process or a low temperature polycrystalline oxide (LTPO) process.

In an embodiment of the inventive concept, the display panel pads PD-DP may include a control pad CSL-P, a data pad DL-P, and a power pad PL-P. Although a gate pad part is not illustrated, the gate pad part may overlap the gate driving circuit DCV and be connected to the gate driving circuit DCV. Although not separately shown, a portion of the non-display area NDA on which the control pad CSL-P, the data pad DL-P, and the power pad PL-P are aligned may be defined as a pad area.

The display panel pads PD-DP may receive electric signals from the outside and transmit the received electric signals to the pixels PX or the gate driving circuit DCV.

Referring to FIG. 3, a top side, a bottom side, a left side, and a right side may be defined in the display panel DP. The bottom side of the display panel DP may be defined as a portion on which the display panel pads PD-DP are disposed in a first direction DR1. The top side of the display panel DP may be defined as an opposite side to the bottom side of the display panel DP in the first direction DR1.

The left side of the display panel DP may be defined as a portion on which the gate driving circuit DCV is illustrated in FIG. 3. The right side of the display panel DP may be defined as an opposite side to the left side of the display panel DP.

In this specification, a top side direction, a bottom side direction, a left side direction, and a right side direction may be defined as a direction in which the top side of the display panel DP exists, a direction in which the bottom side of the display panel DP exists, a direction in which the left side of the display panel DP exists, and a direction in which the right side of the display panel DP exists, respectively.

However, embodiments of the inventive concept are not limited to the top side, bottom side, left side, and right side of the display panel DP. For example, each of the top side, bottom side, left side, and right side of the display panel DP may indicate another side.

FIG. 4 is a view exemplarily illustrating the pixel PX connected to one gate line GL, one data line DL, and the power line PL. However, embodiments of the inventive concept are not limited to the illustrated configuration of the pixel PX.

In an embodiment, the pixel PX includes a light emitting element OLED as a display element. The light emitting element OLED may be a front light emitting diode or a rear light emitting diode. Also, the light emitting element OLED may be a dual light emitting diode. The light emitting element OLED may be an organic light emitting diode. The pixel PX, which is a circuit part for driving the light emitting element OLED, may include a switching transistor TFT-S, a driving transistor TFT-D, and a capacitor CP. The light emitting element OLED generates light by an electrical signal provided from the transistors TFT-S and TFT-D.

The switching transistor TFT-S outputs a data signal applied to the data line DL in response to a scan signal applied to the gate line GL. The capacitor CP charges a voltage corresponding to the data signal received from the switching transistor TFT-S.

The driving transistor TFT-D is connected to the light emitting element OLED. The driving transistor TFT-D controls a driving current flowing through the light emitting element OLED in correspondence to a charge amount stored in the capacitor CP. The light emitting element OLED may emit light in a turn-on period of the driving transistor TFT-D.

The power line PL may provide a first power voltage ELVDD to the light emitting element OLED.

FIG. 5 is a cross-sectional view illustrating the pixel PX according to an embodiment of the inventive concept. FIG. 5 illustrates a cross-section of a portion corresponding to the driving transistor TFT-D and the light emitting element OLED of the equivalent circuit in FIG. 4.

As illustrated in FIG. 5, a circuit layer CL is disposed on a base substrate SUB, which is parallel to a plane defined by the first direction DR1 and a second direction DR2 crossing the first direction DR1. A semiconductor pattern ALD of the driving transistor TFT-D is disposed on the base substrate SUB. The semiconductor pattern ALD may be selected from amorphous silicon, polysilicon, and a metal oxide semiconductor in the same manner or a different manner.

The circuit layer CL may include organic/inorganic layers BFL, 10, 20, and 30, the switching transistor TFT-S (refer to FIG. 4), and the driving transistor TFT-D. The organic/inorganic layers BFL, 10, 20, and 30 may include a buffer layer BFL, a first insulation layer 10, a second insulation layer 20, and a third insulation layer 30.

The buffer layer BFL may be disposed on a surface of the base substrate SUB. The semiconductor pattern ALD may be disposed on the buffer layer BFL. The buffer layer BFL improves a coupling force between the base substrate SUB and conductive patterns or semiconductor patterns. Although not separately shown, a barrier layer for preventing or substantially preventing foreign substances from being introduced may be further disposed on a top surface of the base substrate SUB. The buffer layer BFL and the barrier layer may be selectively provided or omitted.

The first insulation layer 10 for covering the semiconductor pattern ALD is disposed on the base substrate SUB. The first insulation layer 10 includes an organic layer and/or an inorganic layer. In an embodiment, the first insulation layer 10 may include a plurality of inorganic thin-films. In an embodiment, the plurality of inorganic thin-films may include a silicon nitride layer and a silicon oxide layer.

A control electrode GED of the driving transistor TFT-D is disposed on the first insulation layer 10. Although not shown, a control electrode of the switching transistor TFT-S may also be disposed on the first insulation layer 10. In an embodiment, the control electrode GED may be manufactured through a same photolithography process as the gate line GL (refer to FIG. 4). In an embodiment, the control electrode GED may be made of a same material as the gate lines GL, have a same laminated structure as the gate lines GL, and be disposed on a same layer as the gate lines GL.

The second insulation layer 20 for covering the control electrode GED may be disposed on the first insulation layer 10. The second insulation layer 20 includes an organic layer and/or an inorganic layer. In an embodiment, the second insulation layer 20 may include a plurality of inorganic thin-films. In an embodiment, the plurality of inorganic thin-films may include a silicon nitride layer and a silicon oxide layer.

The data lines DL (refer to FIG. 4) may be disposed on the second insulation layer 20. An input electrode SED and an output electrode DED of the driving transistor TFT-D are disposed on the second insulation layer 20. In an embodiment, although not shown, an input electrode and an output electrode of the switching transistor TFT-S (refer to FIG. 4) are also disposed on the second insulation layer 20. The input electrode SED may be branched from a corresponding data line of the data lines DL. The power line PL (refer to FIG. 4) may be disposed on a same layer as the data lines DL. The input electrode SED may be branched from the power line PL.

Some of electrodes of the capacitor CP are disposed on the second insulation layer 20. In an embodiment, some of the electrodes of the capacitor CP may be manufactured through a same photolithograph process, made of a same material, and be disposed on a same layer as the data lines DL and the power line PL.

In an embodiment, the input electrode SED and the output electrode DED are connected to the semiconductor pattern ALD through first and second through-holes CH1 and CH2 passing through the first and second insulation layers 10 and 20. In another embodiment of the inventive concept, each of the switching transistor TFT-S and the driving transistor TFT-D may be deformed into a bottom gate structure.

The third insulation layer 30 for covering the input electrode SED and the output electrode DED is disposed on the second insulation layer 20. The third insulation layer 30 includes an organic layer and/or an inorganic layer. In an embodiment, the third insulation layer 30 may include an organic material to provide a flat surface.

In an embodiment, one of the first, second, and third insulation layers 10, 20, and 30 may be omitted depending on a circuit structure of the pixel. Each of the second and third insulation layers 20 and 30 may be defined as an interlayer insulation layer. The interlayer insulation layer may be disposed between a conductive pattern which is disposed below with respect to the interlayer insulation layer, and a conductive pattern which is disposed above with respect to the interlayer dielectric layer, to insulate the conductive patterns from each other.

A light emitting element layer DP-OLED is disposed on the third insulation layer 30. The light emitting element layer DP-OLED includes a pixel defining layer PDL and a light emitting element OLED. A first electrode AE is disposed on the third insulation layer 30. The first electrode AE is connected to the output electrode DED of the driving transistor TFT-D through a third through-hole CH3 passing through the third insulation layer 30. An opening OP is defined in the pixel defining layer PDL. The opening OP of the pixel defining layer PDL exposes at least a portion of the first electrode AE.

The light emitting element layer DP-OLED includes a light emitting area PXA and a non-light emitting area NPXA disposed adjacent to the light emitting area PXA. In an embodiment, the non-light emitting area NPXA may surround the light emitting area PXA. In an embodiment, the light emitting area PXA is defined in correspondence to the first electrode AE. However, embodiments of the inventive concept are not limited to the light emitting area PXA. For example, the light emitting area PXA may be an area from which light is emitted. The light emitting area PXA may be defined in correspondence to a portion of the first electrode AE, which is exposed by the opening OP.

A hole control layer HCL may be disposed in common on the light emitting area PXA and the non-light emitting area NPXA. Although not separately shown, a common layer such as the hole control layer HCL may be disposed in common on the plurality of pixels PX (refer to FIG. 3).

A light emitting layer EML is disposed on the hole control layer HCL. In an embodiment, the light emitting layer EML may be disposed only on an area corresponding to the opening OP. That is, the light emitting layer EML may be divided and provided on each of the plurality of pixels PX. The light emitting layer EML may contain an organic material or an inorganic material.

An electron control layer ECL is disposed on the light emitting layer EML. A second electrode CE is disposed on the electron control layer ECL. In an embodiment, the second electrode CE is disposed in common on the plurality of pixels PX.

Although the patterned light emitting layer EML is exemplarily illustrated in an embodiment, the light emitting layer EML may be disposed in common on the plurality of pixels PX. Here, the light emitting layer EML may generate white light. Also, the light emitting layer EML may have a multilayer structure.

In an embodiment, the encapsulation substrate EN covers the second electrode CE. In an embodiment of the inventive concept, a support member (not shown) for supporting the encapsulation substrate EN may be further provided. Here, the encapsulation substrate EN contacts the support member. In an embodiment, the encapsulation substrate EN may contain a glass material.

Figure 6:
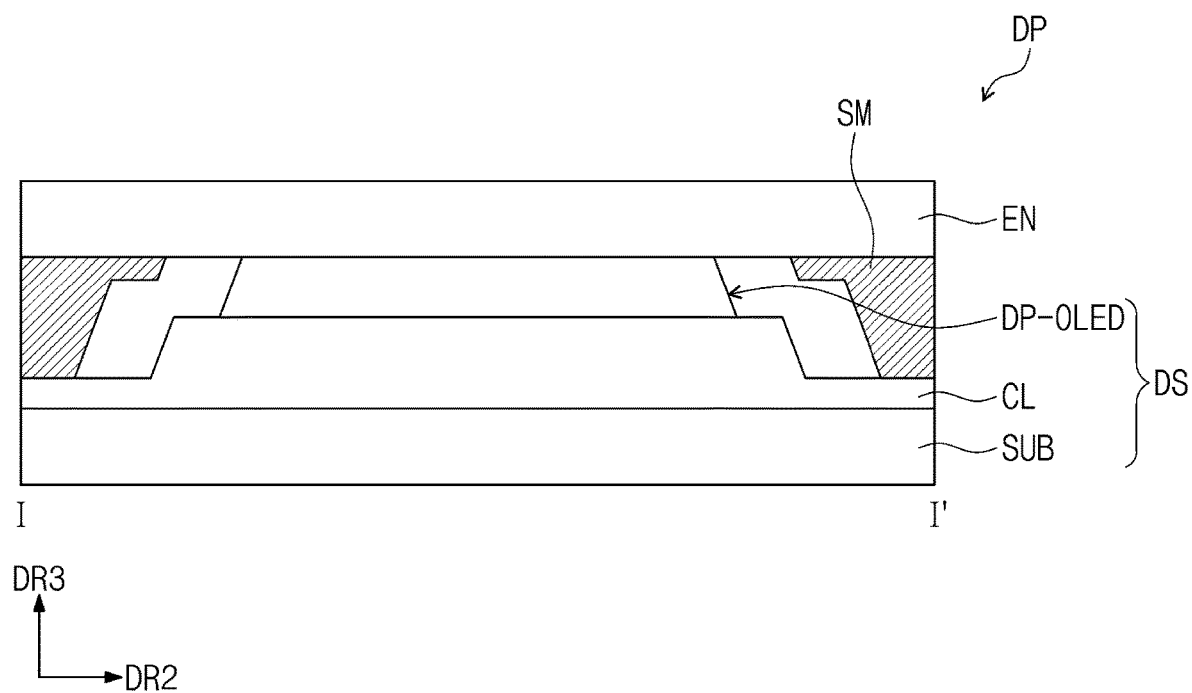
FIG. 6 is a view illustrating a portion of a cross-section taken along the line I-I' of FIG. 3.

FIG. 6 is an enlarged cross-sectional view illustrating the display panel DP according to an embodiment of the inventive concept.

As illustrated in FIG. 6, the display panel DP may include a display substrate DS, an encapsulation substrate EN, and a sealing member SM. The display substrate DS may include a base substrate SUB, a circuit layer CL, and a light emitting element layer DP-OLED. The circuit layer CL may be disposed on the base substrate SUB, and the light emitting element layer DP-OLED may be disposed on the circuit layer CL. The encapsulation substrate EN may be disposed on the display substrate DS. The sealing member SM is disposed between the display substrate DS and the encapsulation substrate EN to allow the display substrate DS to contact the encapsulation substrate EN and seal a gap therebetween.

FIGS. 7 to 11 are views illustrating a portion of a cross-section taken along the line II-II' of FIG. 3. FIGS. 7 to 11 are enlarged views illustrating a cross-section of the display panel DP.

In an embodiment, a laminated structure between the circuit layer CL and the light emitting element layer DP-OLED, which are disposed on the display area DA, is the same as that described with reference to FIG. 5, and, thus, further detailed description thereof will be omitted.

Figure 7:
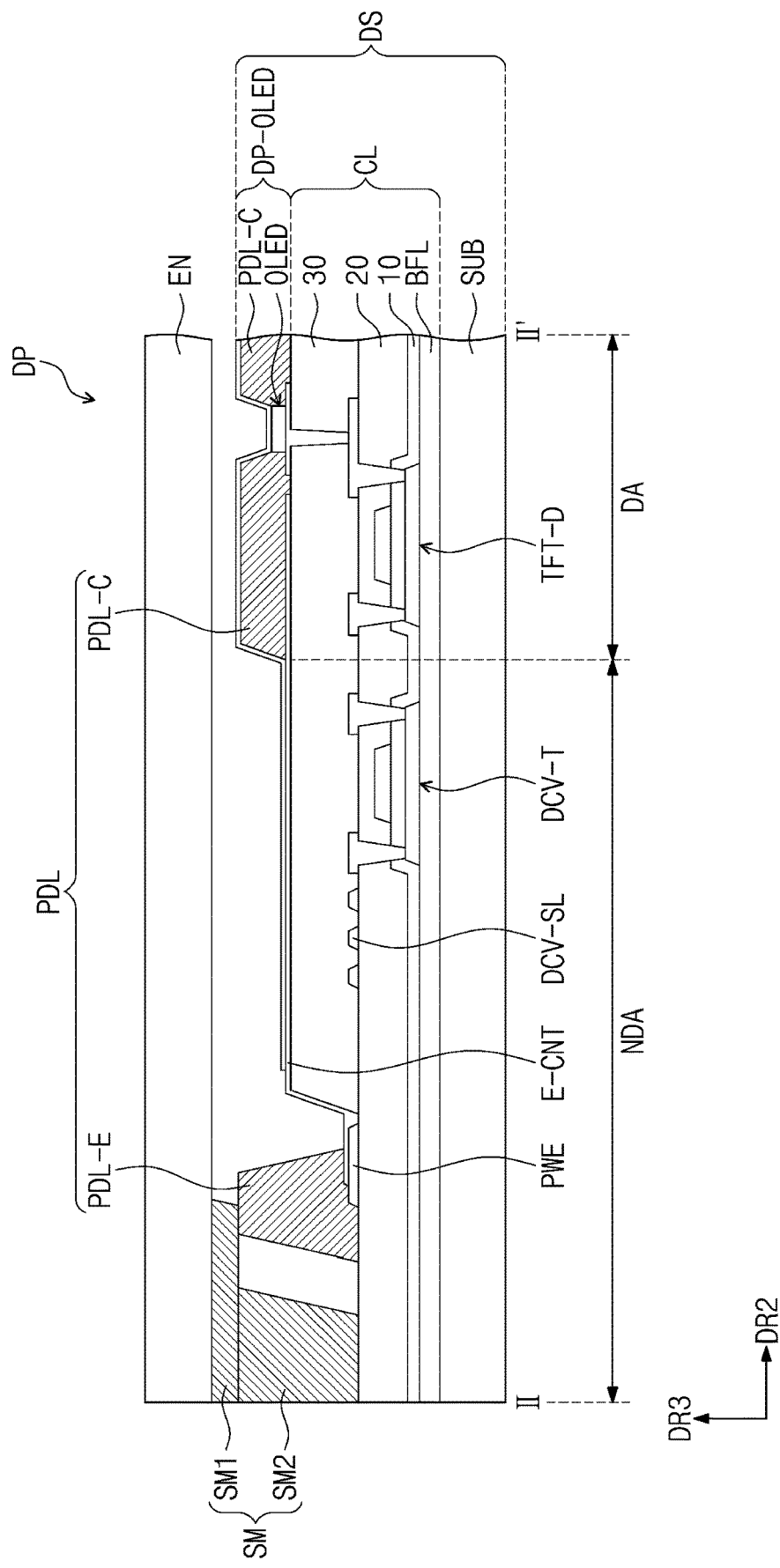
FIGS. 7 to 11 are views illustrating a portion of a cross-section taken along the line II-II' of FIG. 3.

Referring to FIG. 7, a gate driving circuit DCV of the circuit layer CL is disposed on the non-display area NDA. The gate driving circuit DCV includes at least one transistor DCV-T manufactured through a same process as the driving transistor TFT-D. The gate driving circuit DCV may include signal lines DCV-SL disposed on a same layer as the input electrode SED of the driving transistor TFT-D. Although not particularly shown, the gate driving circuit DCV may further include signal lines disposed on a same layer as the control electrode GED of the driving transistor TFT-D.

A power electrode PWE providing the second power voltage ELVSS (refer to FIG. 4) is disposed outside the gate driving circuit DCV. The power electrode PWE may receive a second power voltage ELVSS from the outside. A connection electrode E-CNT disposed on the third insulation layer 30. The connection electrode E-CNT connects the power electrode PWE to the second electrode CE (referring to FIG. 5). In an embodiment, the connection electrode E-CNT is manufactured through a same process as the first electrode AE (referring to FIG. 5), such that the connection electrode E-CNT may include a same layer structure and a same material as the first electrode AE. In an embodiment, the connection electrode E-CNT may have a same thickness as the first electrode AE.

The pixel defining layer PDL may be divided into an edge portion PDL-E overlapping the non-display area NDA and a central portion PDL-C overlapping the display area DA. In an embodiment, the central portion PDL-C and the edge portion PDL-E of the pixel defining layer PDL may be provided through a same process. Accordingly, the central portion PDL-C and the edge portion PDL-E of the pixel defining layer PDL may contain a same material. However, embodiments of the inventive concept are not limited thereto. For example, the edge portion PDL-E and the central portion PDL-C of the pixel defining layer PDL may be separately provided and contain different materials from each other.

Although not shown, the pixel defining layer PDL may be further disposed on the third insulation layer 30 to overlap the non-display area NDA.

The central portion PDL-C of the pixel defining layer PDL may define openings OP corresponding to the light emitting element OLED. That is, the light emitting element layer DP-OLED may be defined by including the light emitting element OLED and the central portion PDL-C of the pixel defining layer PDL.

The edge portion PDL-E of the pixel defining layer PDL may serve as an organic spacer for supporting the encapsulation substrate EN. Accordingly, in this specification, the edge portion PDL-E of the pixel defining layer PDL may be referred to as the organic spacer.

The edge portion PDL-E of the pixel defining layer PDL may be disposed on the power electrode PWE and the circuit layer CL, and at least a portion thereof may overlap the power electrode PWE. Although not shown, in order to maintain a stepped portion of the display panel DP by supporting the encapsulation substrate EN, a support member may be further provided on a top surface of each of the central portion PDL-C and the edge portion PDL-E of the pixel defining layer PDL.

In an embodiment, a distance between a top surface of the second insulation layer 20 to a top surface of the central portion PDL-C of the pixel defining layer PDL may be the same as that between the top surface of the second insulation layer 20 to a top surface of the edge portion PDL-E of the pixel defining layer PDL. However, embodiments of the inventive concept are not limited thereto. For example, a height of each of the central portion PDL-C and the edge portion PDL-E of the pixel defining layer PDL may be adjusted. For example, when the pixel defining layer PDL is patterned by using a halftone mask having a transmission area, a blocking area, and a semi-transmission area, the height of each portion of the pixel defining layer PDL may be adjusted.

In an embodiment, the encapsulation substrate EN may be disposed on a glass display substrate DS. In an embodiment of the inventive concept, the encapsulation substrate EN may contain glass and have a rigid property. However, embodiments of the inventive concept are not limited thereto. For example, the encapsulation substrate EN may contain a well-known material that is easily selected by a person skilled in the art.

The sealing member SM may be disposed between the display substrate DS and the encapsulation substrate EN to couple the display substrate DS and the encapsulation substrate EN. The sealing member SM may include: a first portion SM1 having a side surface overlapping the edge portion PDL-E of the pixel defining layer and aligned with a side surface of the display substrate DS; and a second portion SM2 disposed between the first portion SM1 and the display substrate DS and having a side surface aligned with the side surface of the display substrate DS.

The first portion SM1 may include an inner portion overlapping the edge portion PDL-E of the pixel defining layer PDL and an outer portion extending from the inner portion and disposed outside the inner portion, the inner portion is disposed between the display substrate DS and the encapsulation substrate EN, and the second portion SM2 may be disposed between the display substrate DS and the outer portion of the first portion SM1.

In an embodiment, the first portion SM1 may be disposed to entirely overlap the top surface of the edge portion PDL-E of the pixel defining layer PDL. However, embodiments of the inventive concept are not limited thereto. For example, the first portion SM1 may further extend toward the non-display area NDA. For example, the first portion SM1 may overlap the third insulation layer 30 disposed on the non-display area NDA.

When an external impact caused by falling, or the like, while the display device DD is used is applied, damage may be generated on an attachment surface between the sealing member SM and the encapsulation substrate EN. Accordingly, an attachment force between the sealing member SM and the encapsulation substrate EN is desirably increased for preventing or substantially preventing the damage, and, thus, a sufficient attachment area is desirable to be secured. However, when the sealing member SM is applied to a bottom surface of the encapsulation substrate EN in a wide manner to increase the attachment area, an area of the non-display area NDA may be widened.

According to an embodiment of the inventive concept, since the first portion SM1 of the sealing member SM may overlap the organic spacer PDL-E, a sufficient attachment area may be secured on the encapsulation substrate EN and the first portion SM1 of the sealing member SM while decreasing the area of the non-display area NDA. Accordingly, although the area of the non-display area NDA is decreased, durability of the display device DD may be improved.

The first portion SM1 and the second portion SM2 may define an interface. That is, the first portion SM1 and the second portion SM2 may have different shapes from each other.

In an embodiment, the first portion SM1 may contain at least one of an alkali metal atom and an alkali metal positive ion. The alkali metal positive ion may be a monovalent positive ion. For example, the first portion SM1 may contain at least one of a sodium (Na) atom, a potassium (K) atom, a sodium positive ion (Na+), or a potassium positive ion (K+). When the first portion SM1 contains the alkali metal atom or the alkali metal positive ion, a material of the encapsulation substrate EN and the alkali metal atom or the alkali metal positive ion are anchored to increase the attachment force. In an embodiment, when the display panel DP further includes a coating layer CTL (refer to FIGS. 10 and 11) directly disposed on the bottom surface of the encapsulation substrate EN, the material of the encapsulation substrate EN and the alkali metal atom or the alkali metal positive ion may be anchored to increase the attachment force. For example, as the alkali metal atom or the alkali metal positive ion may be anchored with aluminum Al, silicon (Si), or molybdenum (Mo) of the encapsulation substrate EN or the coating layer CTL, the attachment force may increase.

In an embodiment, the first portion SM1 may have a thickness of about 0.5 µm or more and about 2 µm or less, and, in an embodiment, about 0.7 µm to about 1.5 µm. In this specification, a thickness may represent a length in the third direction DR3, i.e., a length in a normal direction. When the first portion SM1 has a thickness of about 2 µm or more, since a space between the edge portion PDL-E of the pixel defining layer PDL and the encapsulation substrate EN is narrow, an inner portion of the first portion SM1 may not be disposed therein. When the first portion SM1 has a thickness of about 0.5 µm or less, the attachment force between the encapsulation substrate EN and the inner portion of the first portion SM1 may be decreased.

In an embodiment, the second portion SM2 of the sealing member SM may have a thickness of about 2 µm or more and about 8 µm or less, and, in an embodiment, about 3 µm or more to about 5 µm or less. When the second portion SM2 has a thickness of about 2 µm or less, the sealing member SM may not contact the display substrate DS or the encapsulation substrate EN. When the second portion SM2 has a thickness of about 8 µm or more, a stepped portion may be generated between the display substrate DS and the encapsulation substrate EN and decrease the durability of the display device DD.

In an embodiment, a sum of the thicknesses of the first portion SM1 and the second portion SM2 may be about 2.5 µm or more and about 10 µm or less. In an embodiment, the sum of the thicknesses of the first portion SM1 and the second portion SM2 is about 4 µm to about 6 µm, and the display substrate DS and the encapsulation substrate EN may be effectively attached to each other. However, embodiments of the inventive concept are not limited thereto. For example, the thickness of the sealing member SM may be variously changed depending on a size or a material of the display device DD.

In an embodiment, the first portion SM1 may have a width greater than a width of the second portion SM2. For example, in an area in which the sealing member SM is disposed in parallel to the first direction DR1, a length of the first portion SM1 in the second direction DR2 may be greater than a length of the second portion SM2 in the second direction DR2. In an area in which the sealing member SM is disposed in parallel to the second direction DR2, a length of the first portion SM1 in the first direction DR1 may be greater than a length of the second portion SM2 in the first direction DR1.

In an embodiment, a contact surface between the first portion SM1 and the encapsulation substrate EN may have a width of about 300 µm or more and about 700 µm or less, and, in an embodiment, about 400 µm to about 600 µm. When the width of the contact surface is about 300 µm or less, the attachment force between the first portion SM1 and the encapsulation substrate EN may be weakened, and the display device may be easily damaged by an external impact. When the width of the contact surface is about 700 µm or more, the area of the non-display area NDA may be increased.

In an embodiment, a difference between thermal expansion coefficients of the first portion SM1 and the encapsulation substrate EN may be about 5% or less, or the thermal expansion coefficients of the first portion SM1 and the encapsulation substrate EN may be equal to each other. When the difference between thermal expansion coefficients of the first portion SM1 and the encapsulation substrate EN is greater than about 5%, the contact surface between the first portion SM1 and the encapsulation substrate EN may be easily damaged by heat. For example, the contact surface between the first portion SM1 and the encapsulation substrate EN may be damaged by heat, and accordingly the first portion SM1 and the encapsulation substrate EN may be separated from each other. According to an embodiment of the inventive concept, the difference between thermal expansion coefficients of the first portion SM1 and the encapsulation substrate EN is about 5% or less, and the contact surface between the first portion SM1 and the encapsulation substrate EN may not be easily damaged.

In an embodiment, the second portion SM2 may contain a material having an elastic modulus less than that of a material of the first portion SM1. As a result, the second portion SM2 may have an elastic modulus less than that of the first portion SM1.

When the first portion SM1 has an elastic modulus less than that of the second portion SM2, an impact applied from the outside may be concentrated on the first portion SM1, and, thus, the contact surface between the first portion SM1 and the encapsulation substrate EN may be easily damaged.

According to an embodiment of the inventive concept, the second portion SM2 has an elastic modulus less than that of the first portion SM1, and when an external impact is applied, the impact may be concentrated on the second portion SM2 having a smaller elastic modulus, and the second portion SM2 may effectively absorb the impact. Accordingly, the impact applied to the contact surface between the first portion SM1 and the encapsulation substrate EN may decrease, and the contact surface between the first portion SM1 and the encapsulation substrate EN may not be easily damaged. Accordingly, the durability of the display device DD may be improved.

In an embodiment, the sealing member SM may include at least one of $V_2O_5$, ZnO, $TeO_2$, $Al_2O_3$, $Nb_2O_5$, BaO, $Fe_2O_3$, $MnO_2$, CuO, $SiO_2$, and CaO. For example, the sealing member SM may include about 30.0 mol % to about 60.0 mol % of $V_2O_5$, about 20.1 mol % to about 30.0 mol % of ZnO, about 10.0 mol % to about 25.0 mol % of $TeO_2$, about 1.0 mol % to about 5.0 mol % of $Al_2O_3$, about 0.5 mol % to about 5.0 mol % of $Nb_2O_5$, about 0 mol % to about 10.0 mol % of BaO, about 0 mol % to about 5.0 mol % of $Fe_2O_3$, about 1.0 mol % to about 5.0 mol % of $MnO_2$, about 0 mol % to about 5.0 mol % of CuO, about 0 mol % to about 5.0 mol % of $SiO_2$, or about 0 mol % to about 8.0 mol % of CaO. In an embodiment, the first portion SM1 of the sealing member SM may further include at least one of $Ag_2O$, $Bi_2O_3$, $P_2O_5$, $Sb_2O_3$, and $B_2O_3$. The above-described mole ratios (mol %) of the materials may be adjusted to appropriately adjust the thermal expansion coefficient and elastic modulus of the sealing member SM. However, embodiments of the inventive concept are not limited thereto. For example, the sealing member SM may further include a material that is well-known to a person skilled in the art.

Figure 8:
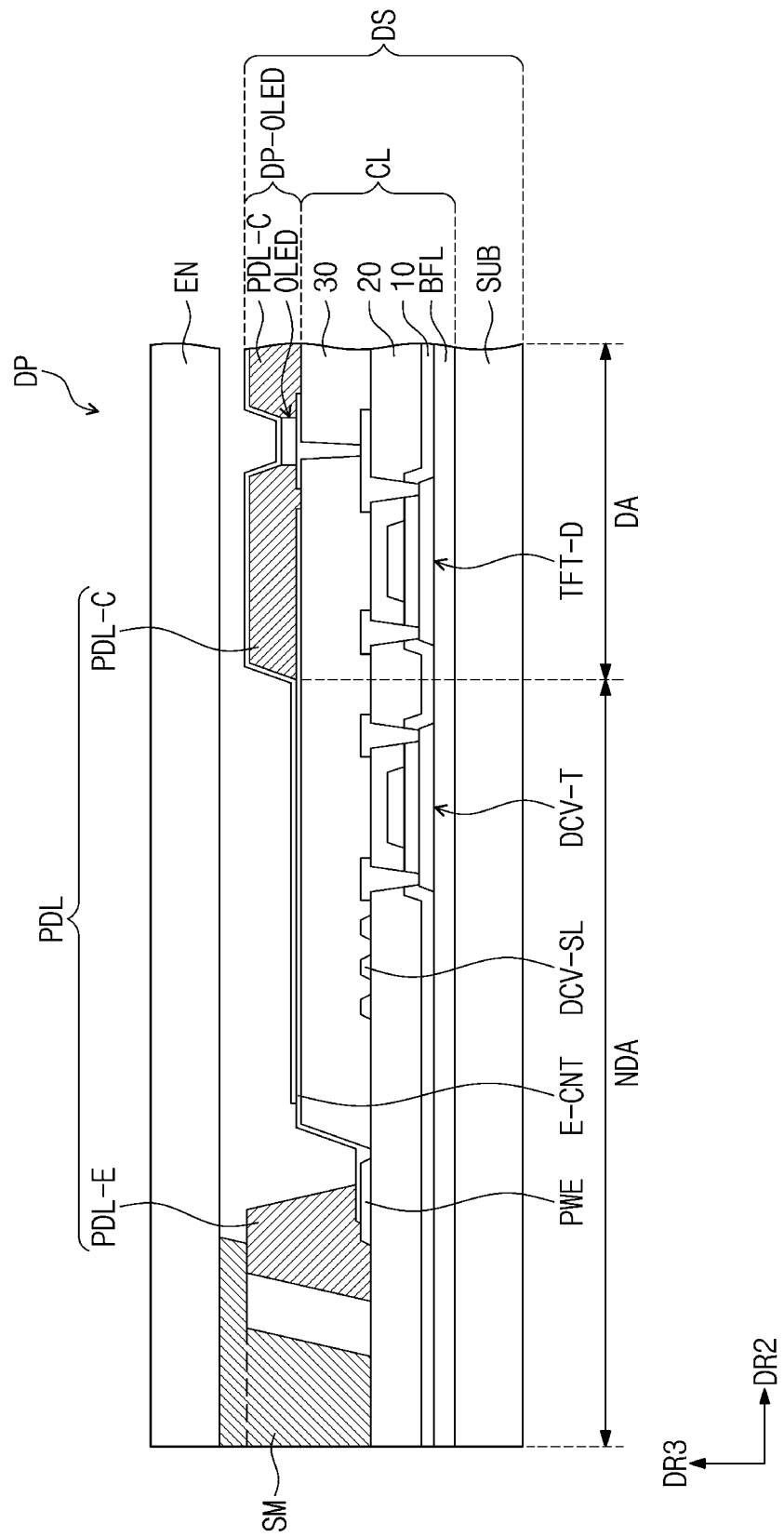

Referring to FIG. 8, in an embodiment, the first portion SM1 and the second portion SM2 may be integrated with each other and include a same material as each other.

Figure 9:
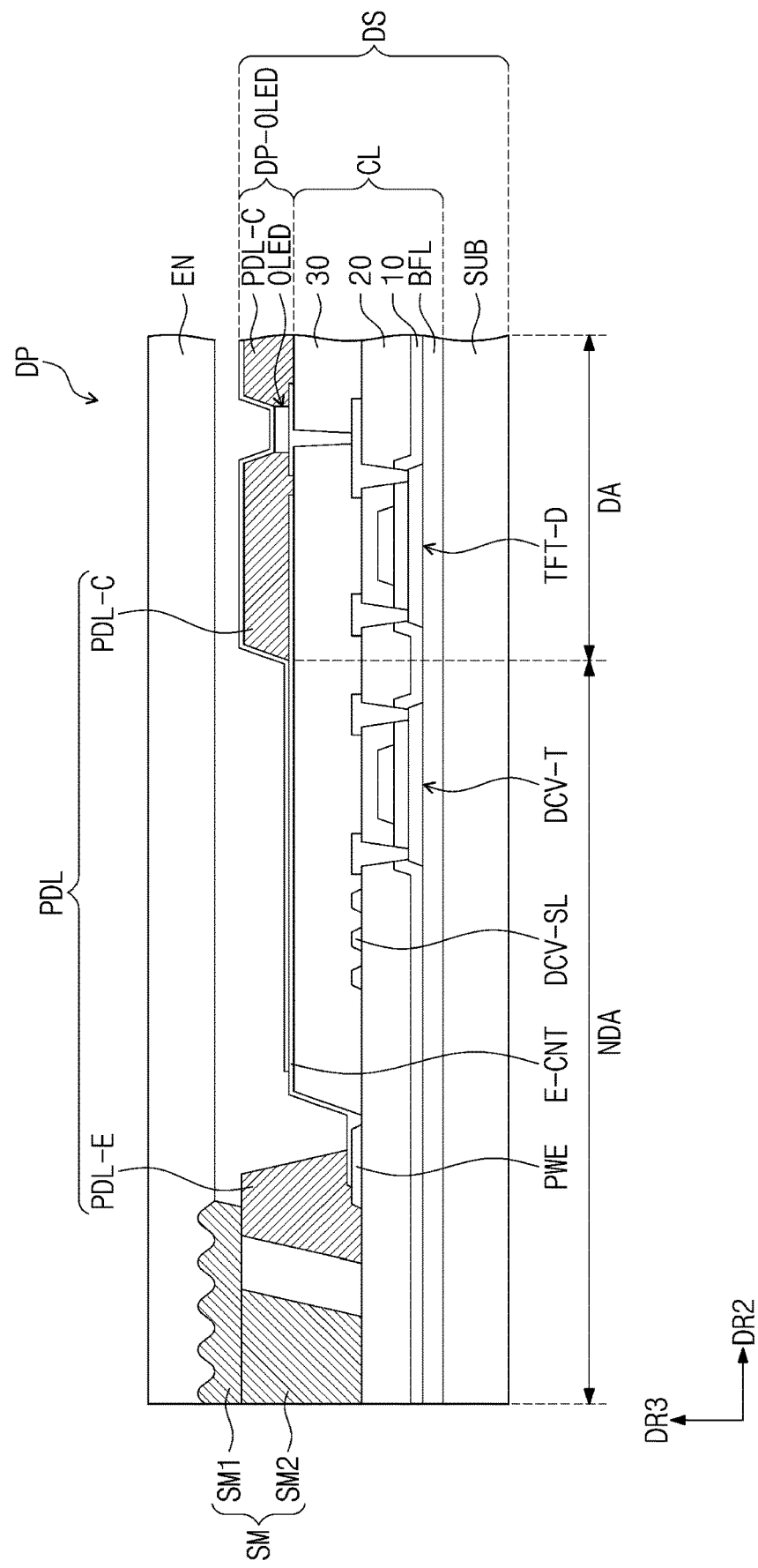

Referring to FIG. 9, in an embodiment, the sealing member SM may be directly disposed on the bottom surface of the encapsulation substrate EN. A pattern may be defined in a contact area of the bottom surface of the encapsulation substrate EN, which contacts the first portion SM1 of the sealing member SM. In an embodiment, the pattern may have a circular shape and may be defined in an arbitrary manner on a plane. However, embodiments of the inventive concept are not limited thereto. For example, the pattern may have any of various shapes and be defined in a regular distance.

The pattern may be generated by processing the encapsulation substrate EN in a physical or chemical manner. For example, the pattern may be manufactured by using a wet blasting process that generates a pattern by spraying a mixture of water and abrasive to the encapsulation substrate EN. Also, the pattern may be chemically manufactured through an etching process. Also, the pattern may be manufactured by polishing the encapsulation substrate EN through the wet blasting process and then chemically etching a crack generated by an impact during the process. However, embodiments of the inventive concept are not limited thereto. For example, the pattern may be manufactured by a method that is easily carried out by a person skilled in the art.

Since the pattern is defined in the bottom surface of the encapsulation substrate EN, the contact area between the first portion SM1 and the encapsulation substrate EN may be increased. Accordingly, the attachment force between the first portion SM1 and the encapsulation substrate EN may be increased, and the durability of the display device DD may be improved.

Figure 10:
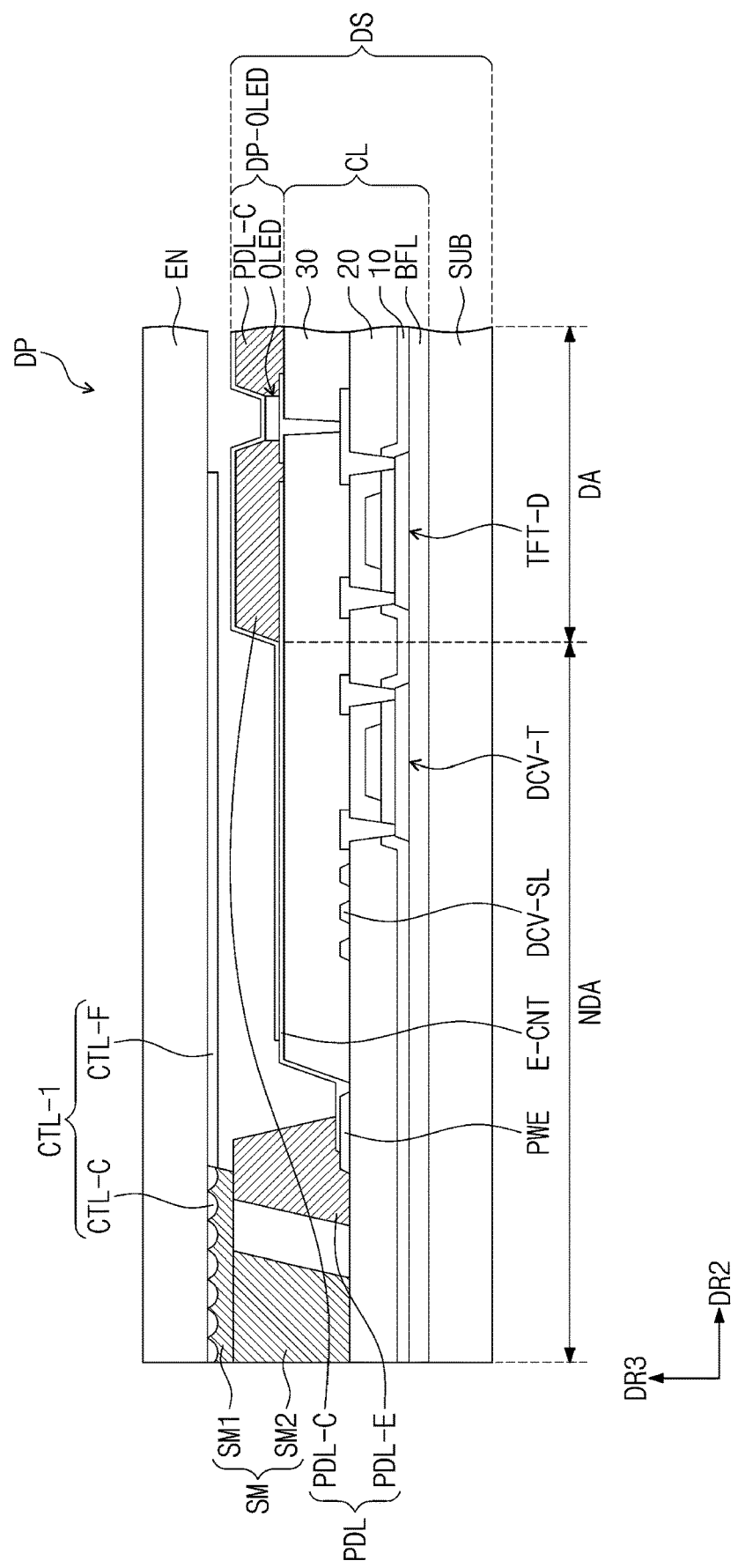
Figure 11:
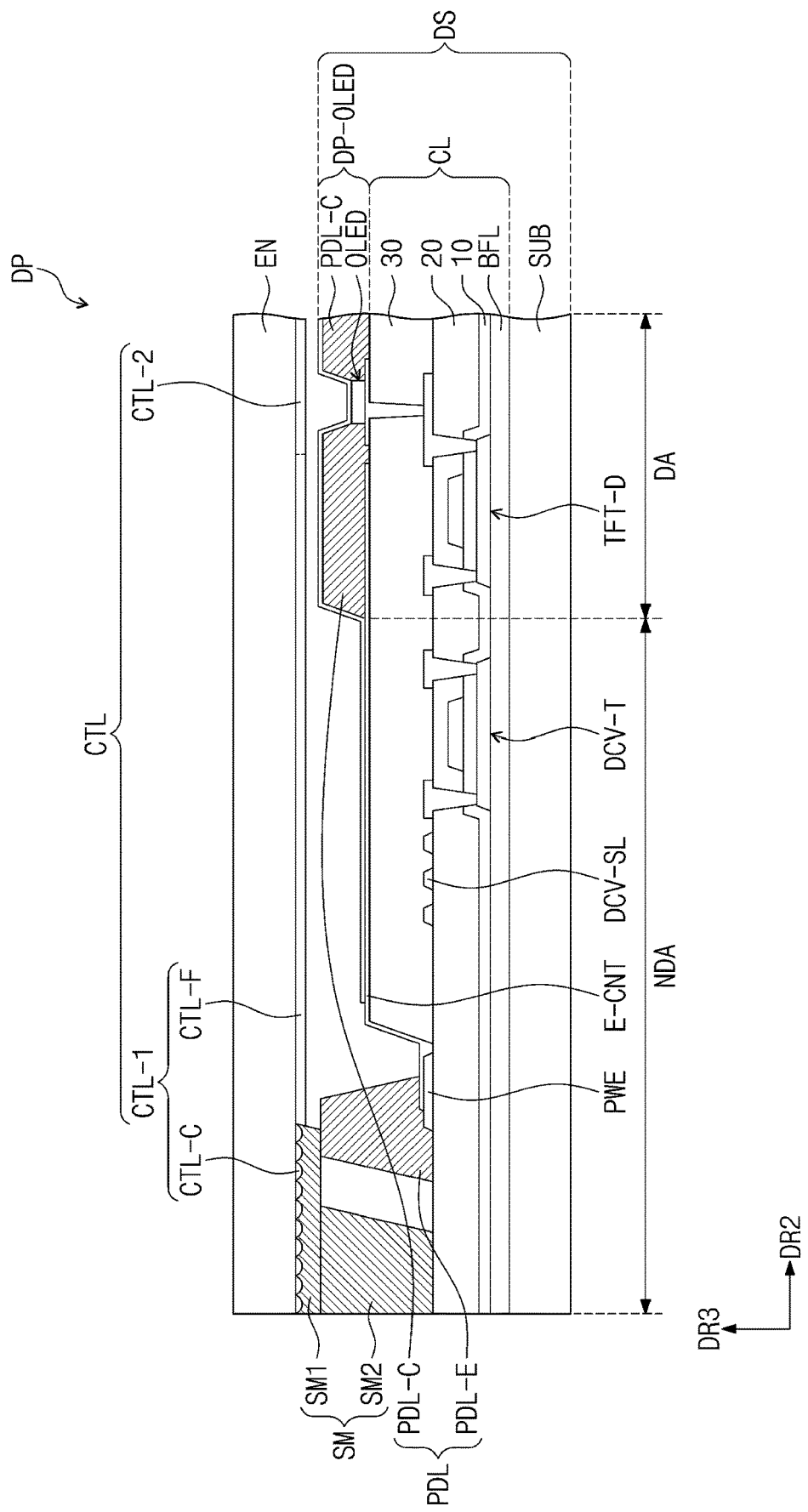

As illustrated in FIGS. 10 and 11, the display panel DP may further include a coating layer CTL.

Referring to FIG. 11, in an embodiment, the coating layer CTL may include a first coating portion CTL-1 overlapping the non-display area NDA and a second coating portion CTL-2 overlapping the display area DA. As the coating layer CTL overlaps all of the display area DA and the non-display area NDA, an additional mask may not be used during a process. Accordingly, a process may be simplified, and a process efficiency may be increased. In an embodiment, the second coating portion CTL-2 may have a light transmittance of about 90% or more, and, in an embodiment, about 99% or more. When the second coating portion CTL-2 has a light transmittance of about 90% or less, a light output efficiency of the display device DD may be reduced.

Referring to FIG. 10, in an embodiment, the coating layer CTL may include only a first coating portion CTL-1 overlapping the non-display area NDA. When the coating layer CTL overlaps only the non-display area NDA, a light output efficiency of the display area DA may be increased, and, thus, the light output efficiency of the display device DD may also be increased. In an embodiment, the first coating portion CTL-1 may be disposed to overlap only the first portion SM1 of the sealing member SM.

Referring to FIGS. 10 and 11, the sealing member SM may be directly disposed on or contacting a bottom surface of the first coating portion CTL-1. In an embodiment, a pattern may be defined in an area of the bottom surface of the first coating portion CTL-1, which contacts the sealing member SM, and the area may be referred to as a pattern coating layer CTL-C. A portion of the first coating portion CTL-1 on which the pattern is not defined may be referred to as a flat coating layer CTL-F. According to an embodiment of the inventive concept, since the pattern is defined in the coating layer CTL, the pattern may not be directly defined in the encapsulation substrate EN. Accordingly, the encapsulation substrate EN may be prevented or substantially prevented from being damaged. Since the coating layer CTL may absorb an impact applied from the outside, and when the pattern is defined in the coating layer CTL, a contact area between the coating layer CTL and the first portion SM1 of the sealing member may SM be increased, and the durability of the display device DD may be improved.

Description for the above-described pattern may be substantially the same as that for the pattern described in FIG. 9, and, thus, further detailed description thereof will be omitted.

In an embodiment, the coating layer CTL may include at least one of metal, metallic oxide, silicon oxide ($Si_xO_y$), and silicon nitride (SixNy). For example, the coating layer may include at least one of titanium dioxide ($TiO_2$), titanium nitride (TiN), zinc oxide (ZnO), silicon dioxide ($SiO_2$), or silicon nitride ($Si_3N_4$). However, embodiments of the inventive concept are not limited thereto. For example, the coating layer CTL may contain a well-known material that is easily selected by a person skilled in the art.

In an embodiment, a sum of a thickness of the first portion SM1 of the sealing member SM and a thickness of the coating layer CTL may be about 0.5 μm or more and about 2 μm or less, and, in an embodiment, about 0.7 μm to about 1.5 μm. In an embodiment, the second portion SM2 of the sealing member SM may have a thickness of about 2 μm or more and about 8 μm or less, and, in an embodiment, about 3 μm or more to about 5 μm or less. In an embodiment, a sum of the thicknesses of the first portion SM1, the second portion SM2, and the coating layer CTL may be about 2.5 μm or more and about 10 μm or less. Description for the above-described thicknesses may be substantially the same as that for the thicknesses of the sealing member SM described in FIG. 8, and, thus, further detailed description thereof will be omitted.

Figure 12:
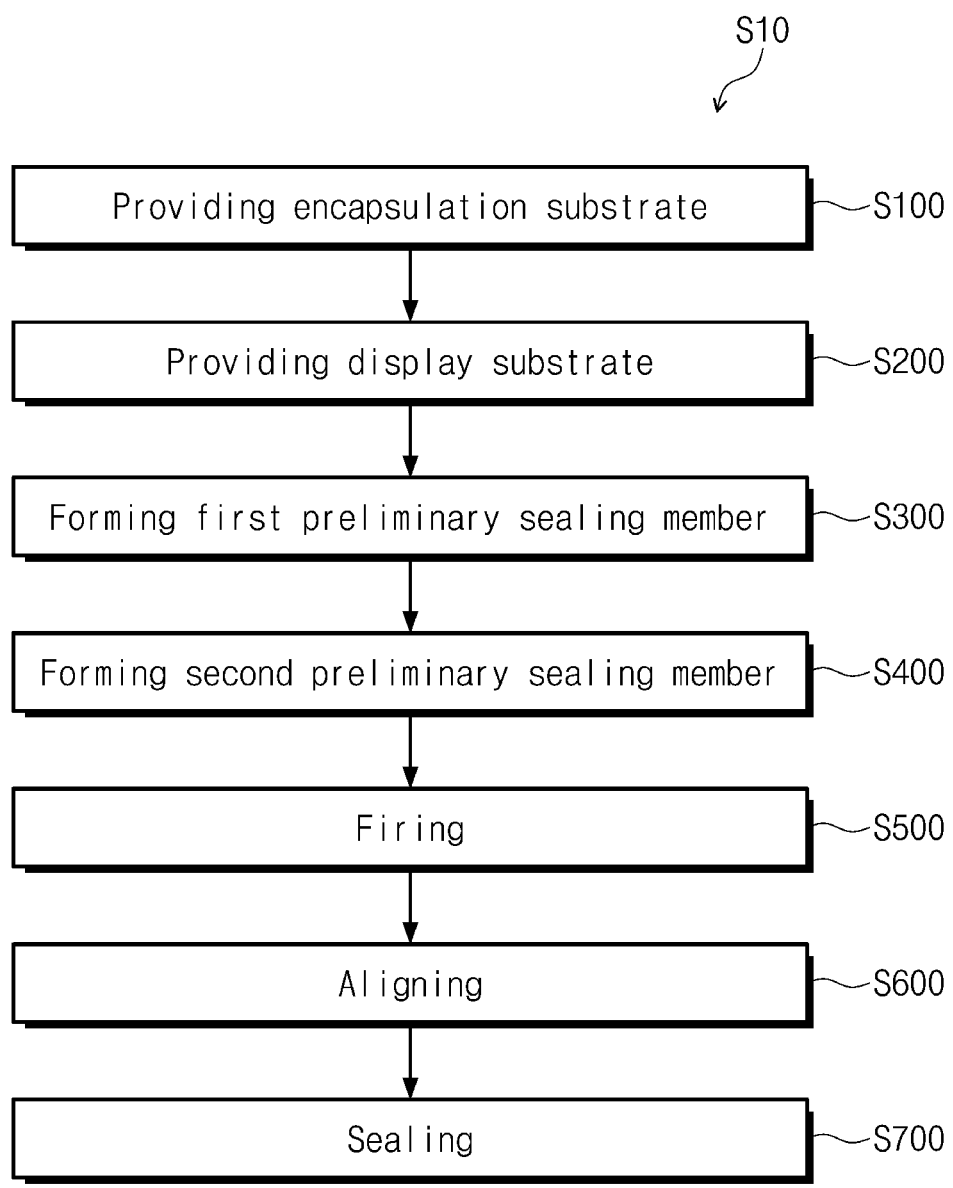
FIG. 12 is a flowchart showing a method for manufacturing a display device according to an embodiment of the inventive concept.

FIG. 12 is a flowchart showing a method for manufacturing a display device DD according to an embodiment of the inventive concept. A method S10 of manufacturing a display device DD may include: a process S100 of providing an encapsulation substrate; a process S200 of providing a display substrate; a process S300 of forming a first preliminary sealing member; a process S400 of forming a second preliminary sealing member, a firing process S500; an alignment process S600; and a sealing process S700. Although a specific process sequence of the method of manufacturing the display device DD is shown in FIG. 12, the sequence of the processes can be changed by those skilled in the art. Hereinafter, the method of manufacturing the display device DD is described in detail by referring to FIGS. 13A to 13F.

FIGS. 13A to 13F are views for explaining the method S10 of manufacturing a display device DD.

Figure 13A:
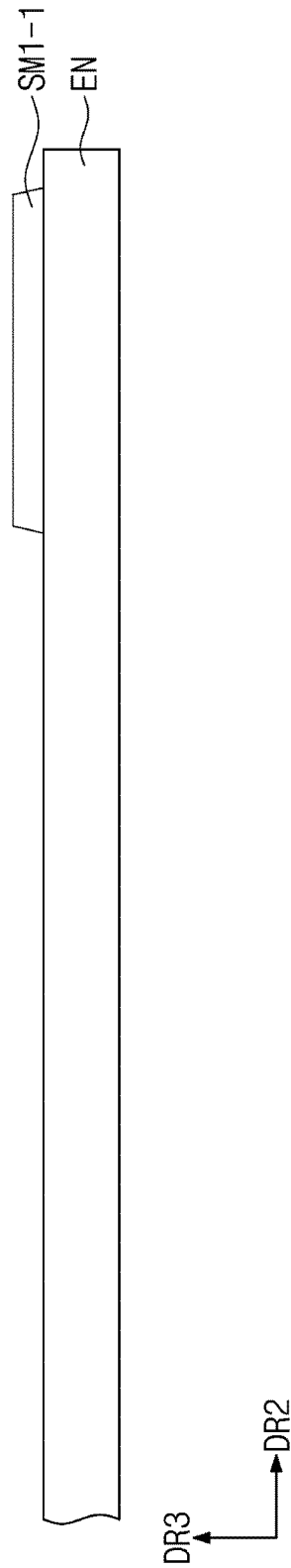
FIG. 13A is a view illustrating a process of forming a first preliminary sealing member of FIG. 12.

FIG. 13A is a view for explaining the process S100 of providing an encapsulation substrate and the process S300 of forming a first preliminary sealing member. Referring to FIGS. 12 and 13A, an encapsulation substrate EN is provided in the process S100 of providing an encapsulation substrate. In the process S300 of forming a first preliminary sealing member, a first preliminary sealing member SM1-1 may be applied on the encapsulation substrate EN. Thereafter, the first preliminary sealing member SM1-1 may be dried.

Figure 13B:
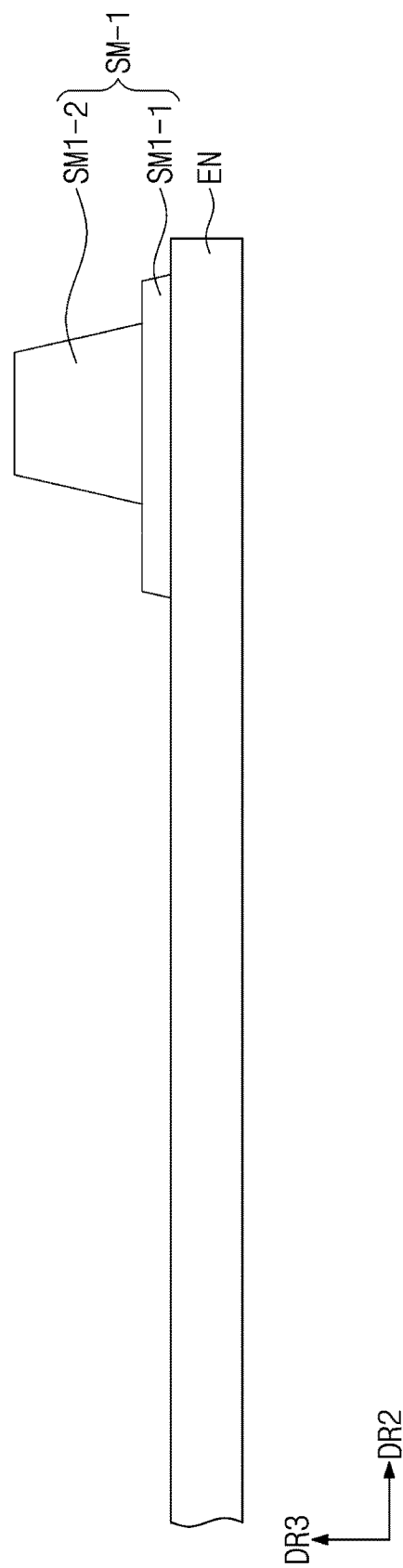
FIG. 13B is a view illustrating a process of forming a second preliminary sealing member of FIG. 12.

FIG. 13B is a view for explaining the process S400 of forming a second preliminary sealing member. Referring to FIGS. 12 and 13B, in the process S400 of forming a second preliminary sealing member, a second preliminary sealing member SM1-2 may be applied on the first preliminary sealing member SM1-1. Thereafter, the second preliminary sealing member SM1-2 may be dried. The second preliminary sealing member SM1-2 may partially overlap the first preliminary sealing member SM1-1.

Figure 13C:
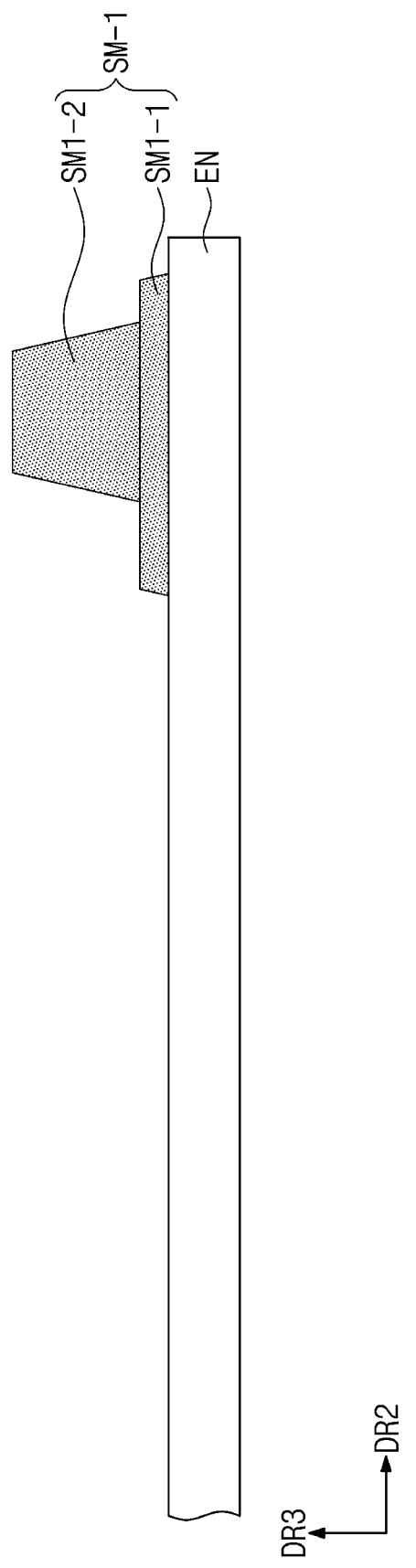
FIG. 13C is a view illustrating a firing process of FIG. 12.

FIG. 13C is a view for explaining the firing process S500. Referring to FIGS. 12 and 13C, in the firing process S500, a preliminary sealing member SM-1 is fired. The embodiment of the inventive concept is not particularly limited to the firing method. For example, a firing method that is well-known to a person skilled in the art may be used.

Figure 13D:
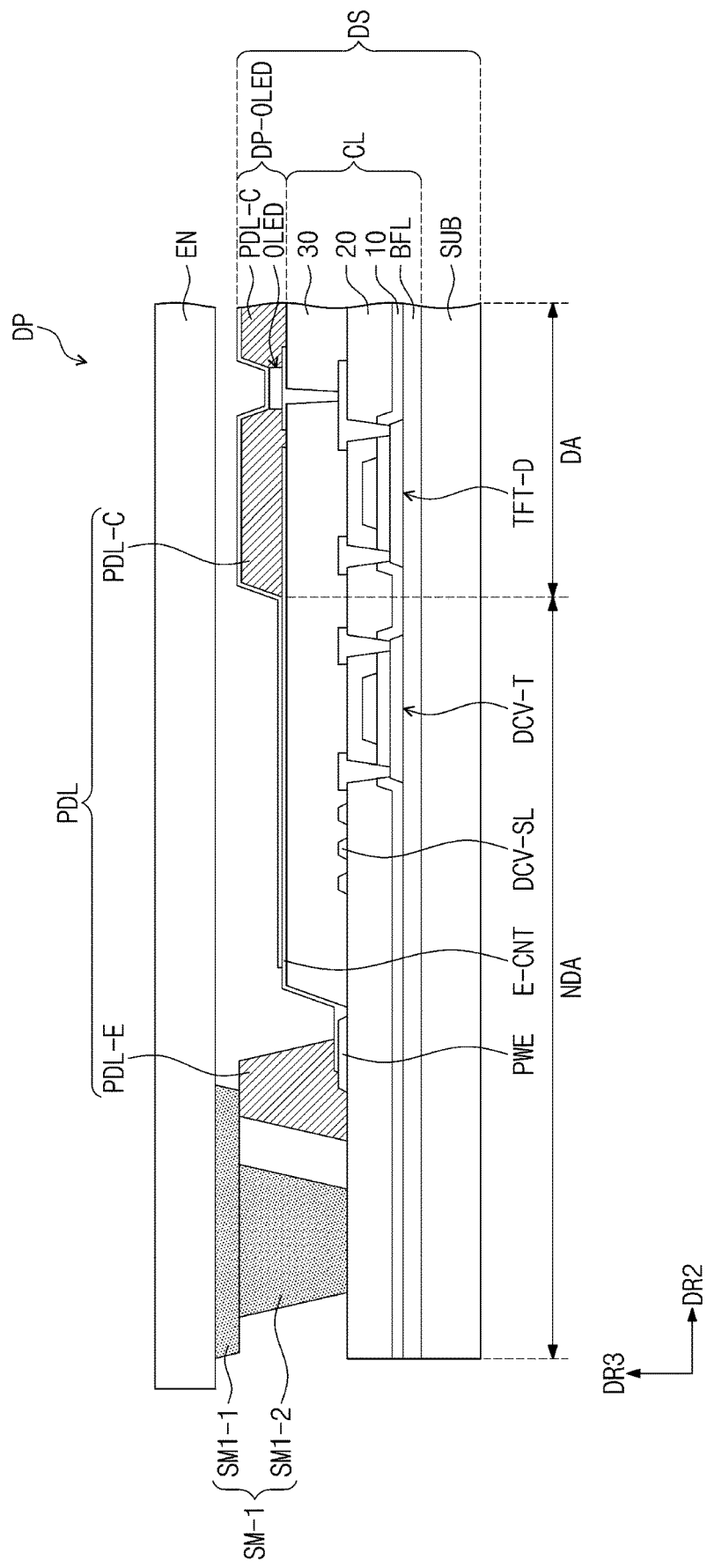
FIG. 13D is a view illustrating an alignment process of FIG. 12.

FIG. 13D is a view for explaining the process S200 of providing a display substrate and the alignment process S600. Referring to FIGS. 12 and 13D, in the process S200 of providing a display substrate, a display substrate DS is provided. Description for the display substrate DS may be substantially the same as that described in FIGS. 7 to 11, and, thus, further detailed description thereof will be omitted.

In the alignment process S600, the encapsulation substrate EN and the display substrate DS may be aligned with each other. Here, the encapsulation substrate EN and the display substrate DS may be aligned in the same manner as the arrangement of the display panel DP in FIGS. 7 to 8.

Figure 13E:
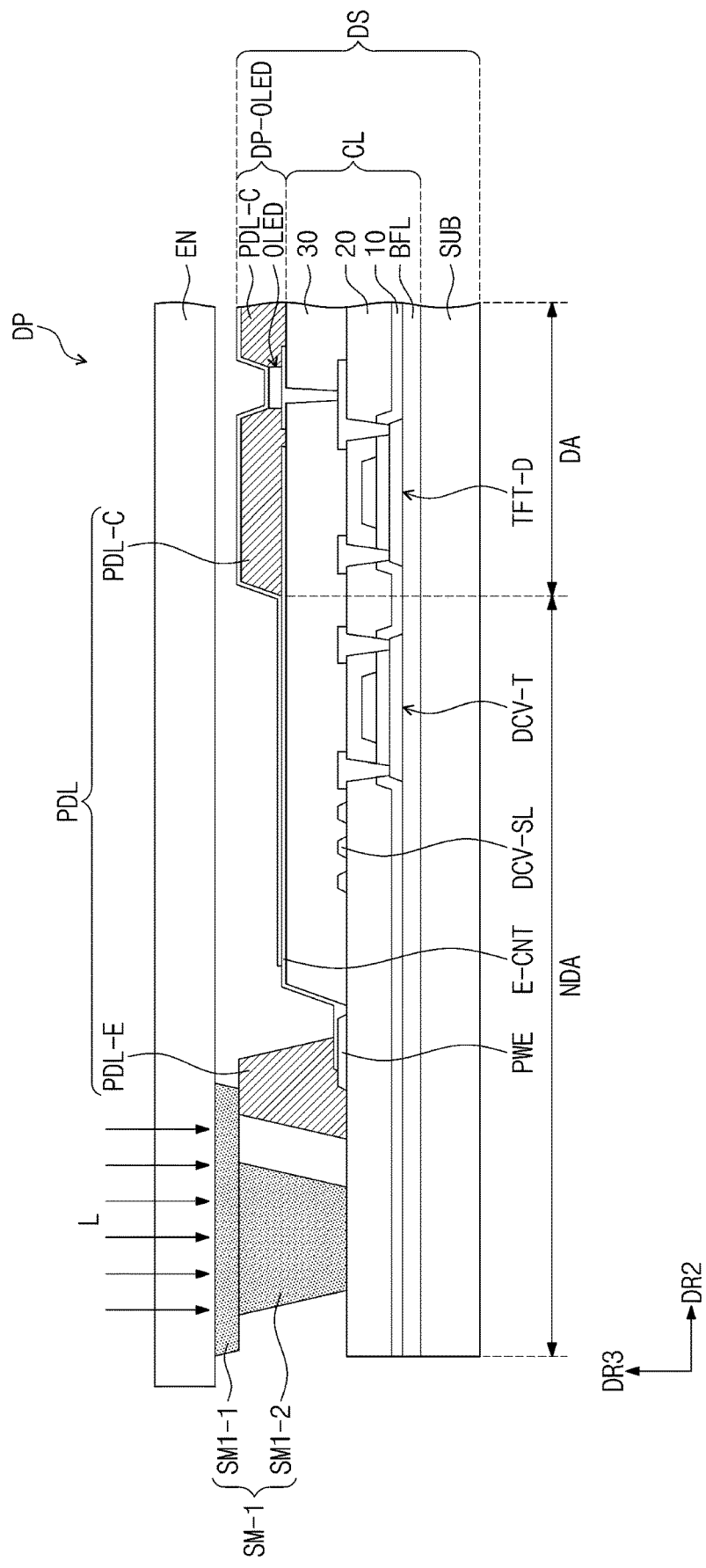
FIG. 13E is a view illustrating a sealing process of FIG. 12.

FIG. 13E is a view for explaining the sealing process S700. Referring to FIGS. 12 and 13E, heat (e.g., a predetermined heat) may be applied to the preliminary sealing member SM-1. The preliminary sealing member SM-1 is melted by the heat (e.g., predetermined heat), and is attached to the encapsulation substrate EN while the melted preliminary sealing member SM-1 is cooled and solidified.

In an embodiment, the heat (e.g., predetermined heat) may be about 350° C. or more and about 600° C. or less, and, in an embodiment, about 400° C. or more and about 500° C. or less. When the heat is less than about 350° C., the preliminary sealing member SM-1 may not be sufficiently melted and thus may not be sufficiently attached, and when the heat is greater than about 600° C., the display substrate DS may be damaged by the heat, or crystallization of the preliminary sealing member SM-1 may not be properly performed. In an embodiment, the heat (e.g., predetermined heat) may be applied through irradiation of a laser beam L. However, embodiments of the inventive concept are not limited thereto. For example, the heat may be applied by a method that is easily carried out by a person skilled in the art.

Figure 13F:
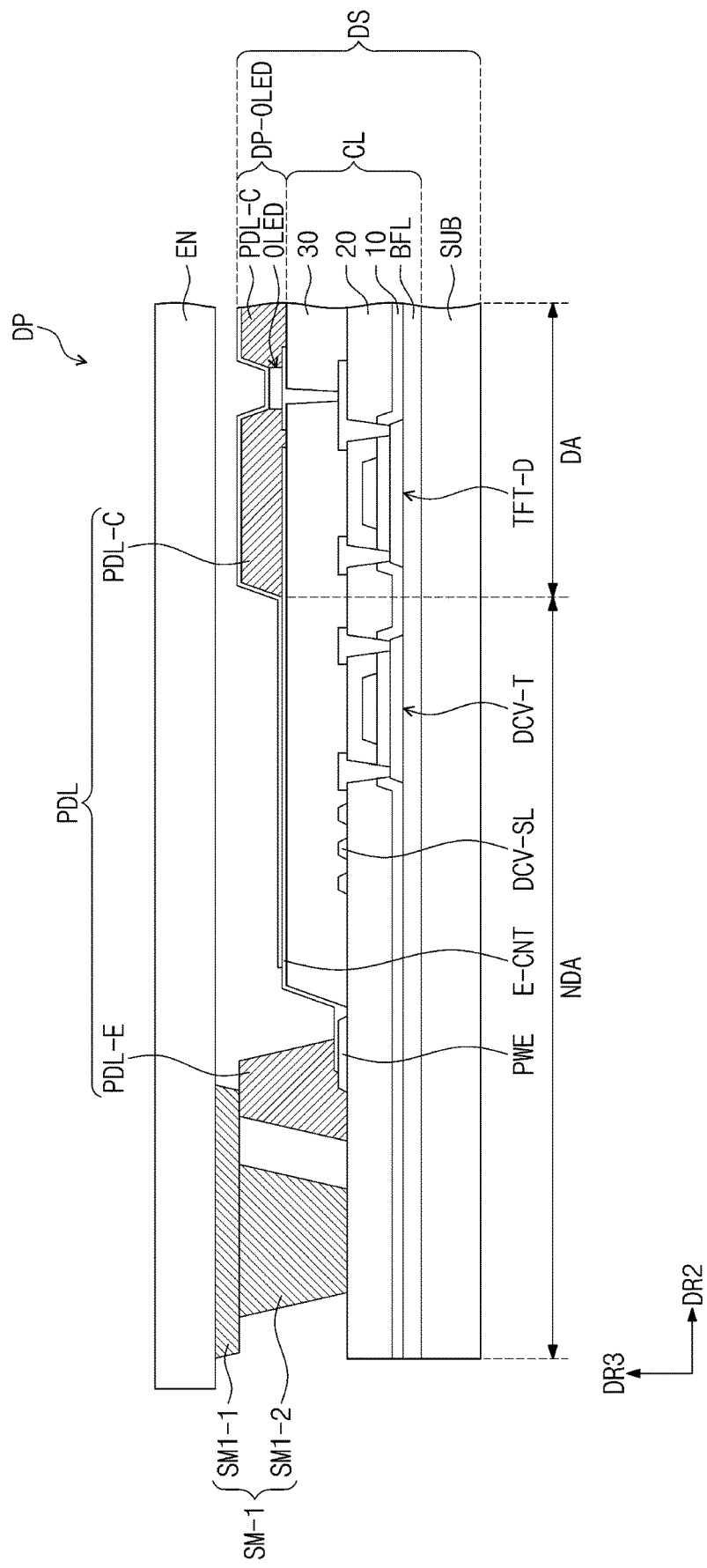
FIG. 13F is a cross-sectional view illustrating a display panel before being cut according to an embodiment of the inventive concept.

FIG. 13F is a cross-sectional view illustrating the display panel DP before being cut according to an embodiment of the inventive concept. Although not shown, in an embodiment, the same process is performed on a plurality of cell areas, which are set on a mother substrate, to form the display panel DP on each of the plurality of cell areas. After the manufacturing process is completed, the display panels DP are separated by cutting the mother substrate.

Figure 13G:
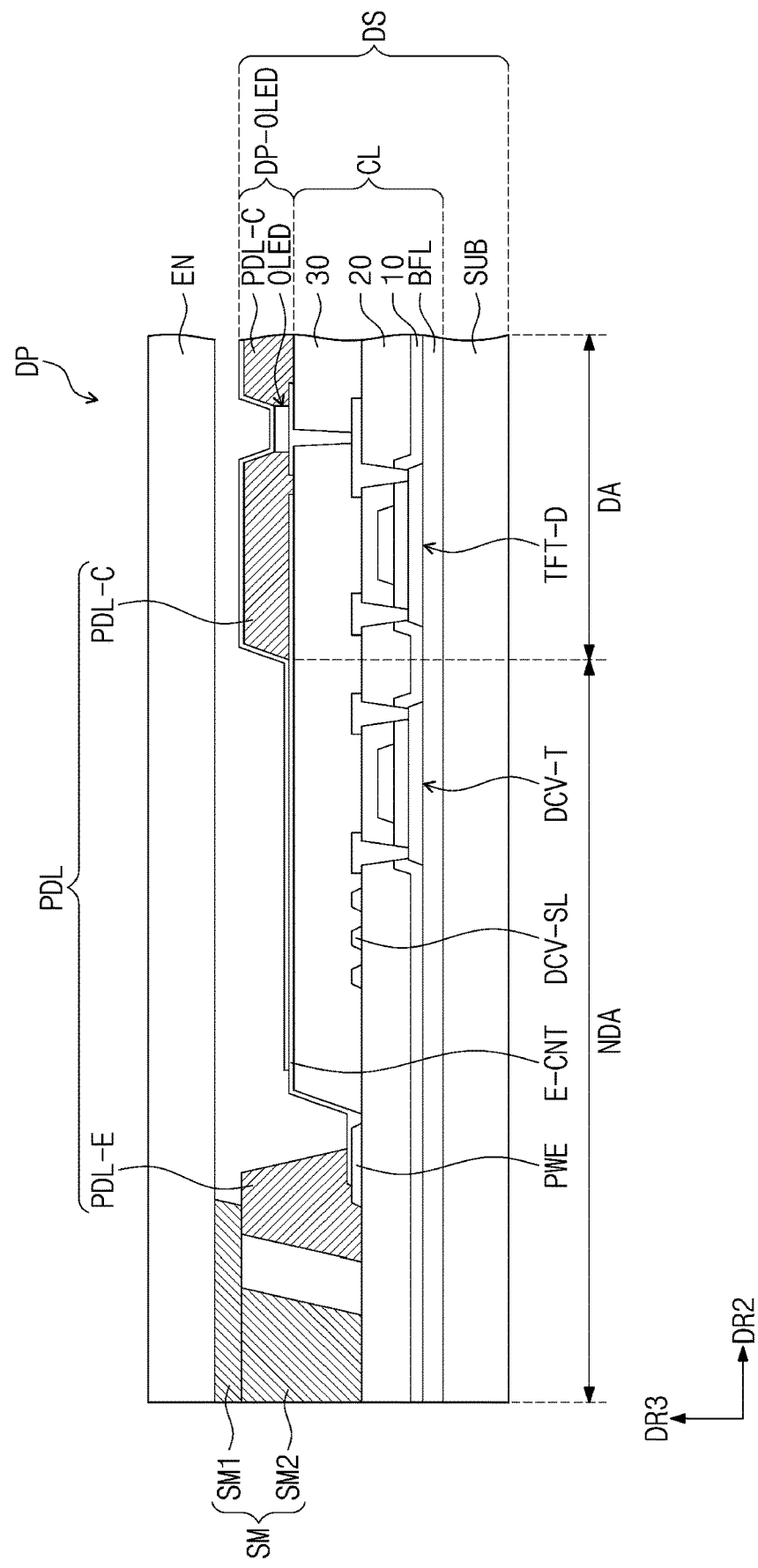
FIG. 13G is a cross-sectional view illustrating a manufactured display panel according to an embodiment of the inventive concept.

FIG. 13G is a cross-sectional view illustrating the display panel DP that is manufactured through the above-described method S10 of manufacturing a display device DD. Referring to FIG. 13G, the display panels DP that are separated by cutting the mother substrate are illustrated.

However, embodiments of the inventive concept are not limited to the sequence of the method S10 of manufacturing a display device DD which is described with reference to FIGS. 12 and 13A to 13F. For example, the sequence may be changed within a range that is easily carried out by a person skilled in the art.

Figure 14A:
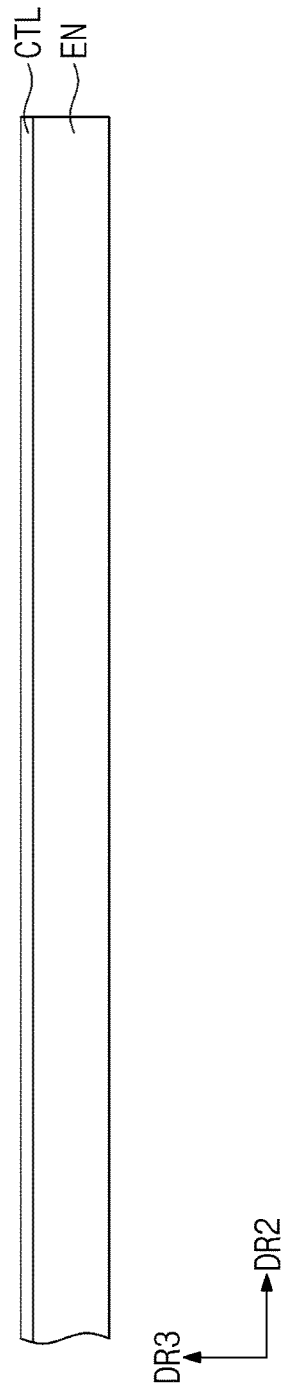
FIG. 14A is a view illustrating a process of forming a coating layer according to an embodiment of the inventive concept.

Referring to FIG. 14A, in an embodiment, the method S10 of manufacturing a display device DD may further include a process of arranging a coating layer CTL on the encapsulation substrate EN. Although not shown, the coating layer CTL may be disposed not to overlap the display area DA of the display substrate DS in a following process.

Figure 14B:
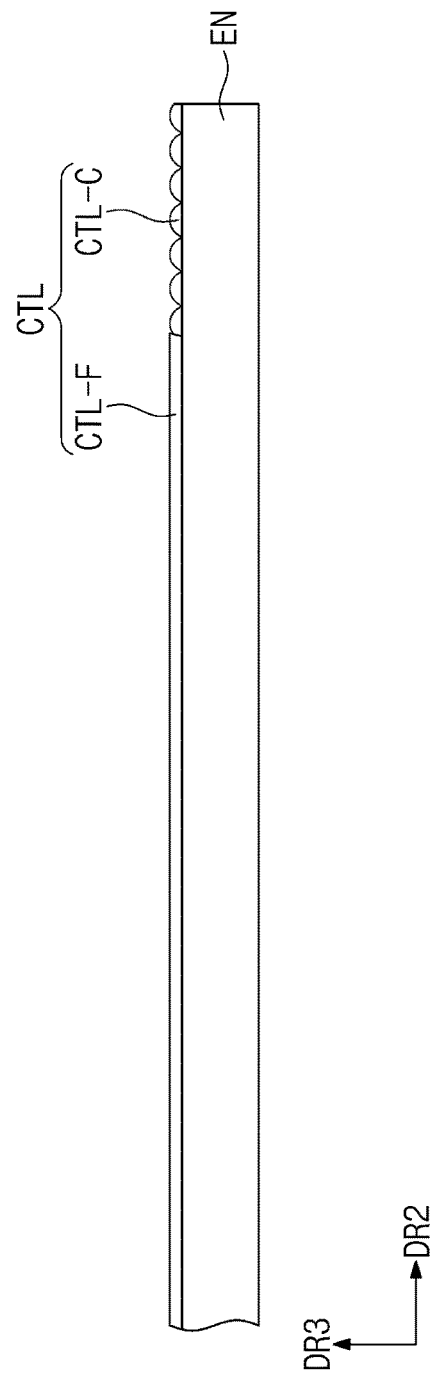
FIG. 14B is a view illustrating a process of forming a pattern according to an embodiment of the inventive concept.

Referring to FIG. 14B, the method S10 of manufacturing a display device DD may further include a process of forming a pattern on an area of the coating layer CTL, on which the first preliminary sealing member SM1-1 is disposed, i.e., an area corresponding to a portion to which the sealing member SM is attached. Processes which will be performed thereafter may be substantially the same as features described in FIGS. 13A to 13G except that the first preliminary sealing member SM1-1 is applied on a pattern coating layer CTL-C, and, thus, further detailed description will be omitted.

The display device DD according to embodiments of the inventive concept may be sufficiently strong against an external impact by widening the contact area between the sealing member SM and the encapsulation substrate EN.

The display device DD according to embodiments of the inventive concept may have the reduced area of the non-display area NDA because the sealing member SM is disposed between the encapsulation substrate EN and the edge portion PDL-E of the pixel defining layer PDL.

The display device DD according to embodiments of the inventive concept is sufficiently strong by widening the contact area between the sealing member SM and the encapsulation substrate EN.

Although some example embodiments of the present invention have been described, it is to be understood that the present invention should not be limited to these example embodiments, but various changes and modifications may be made by one of ordinary skill in the art within the spirit and scope of the present invention as herein claimed.

What is claimed is:

1. A display device comprising:
    a display substrate comprising a base substrate including a display area and a non-display area, a circuit layer on the base substrate, light emitting elements on the circuit layer and overlapping the display area, and a pixel defining layer on the circuit layer and in which openings corresponding to the light emitting elements are defined;
    an encapsulation substrate over the display substrate; and
    a sealing member coupling the display substrate and the encapsulation substrate and non-overlapping the display area,
    wherein the pixel defining layer comprises an edge portion overlapping the non-display area, and a central portion overlapping the display area, the edge portion comprising an outer surface facing away from the display area, and
    the sealing member comprises:
    a first portion comprising an inner portion between the display substrate and the encapsulation substrate and overlapping the edge portion of the pixel defining layer, and an outer portion extending from the inner portion and located outside the inner portion; and
    a second portion between the outer portion and the display substrate and spaced apart from the edge portion of the pixel defining layer,
    wherein the first portion and the second portion define an interface,
    wherein the sealing member is spaced from the outer surface of the edge portion of the pixel defining layer so as to define a gap therebetween along an outward direction extending from the display area toward the non-display area,
    wherein the second portion comprises a material having an elastic modulus less than that of a material of the first portion, and
    the first portion is adjacent to the encapsulation substrate, and the second portion is spaced apart from the encapsulation substrate.

2. The display device of claim 1, wherein the first portion of the sealing member has a thickness of about 0.5 µm or more and about 2 µm or less, and
    a sum of thicknesses of the first portion and the second portion of the sealing member is about 2.5 µm or more and about 10 µm or less.

3. The display device of claim 1, wherein the base substrate is parallel to a plane defined by a first direction and a second direction crossing the first direction, and
    the first portion has a width greater than a width of the second portion on the plane.

4. The display device of claim 1, wherein the first portion comprises at least one of an alkali metal atom and an alkali metal positive ion.

5. The display device of claim 1, wherein a difference between thermal expansion coefficients of the first portion and the encapsulation substrate is about 5% or less.

6. The display device of claim 1, wherein the sealing member is directly disposed on a bottom surface of the encapsulation substrate, and
    a pattern is defined in a contact area of the bottom surface of the encapsulation substrate which contacts the sealing member.

7. The display device of claim 1, further comprising a coating layer directly disposed on a bottom surface of the encapsulation substrate.

8. The display device of claim 7, wherein the coating layer comprises a first coating portion overlapping the non-display area and a second coating portion overlapping the display area, and
    the second coating portion overlapping the display area has a light transmittance of about 90% or more.

9. The display device of claim 8, wherein a sum of a thickness of the first portion of the sealing member and a thickness of the coating layer contacting the first portion is about 0.5 µm or more and about 2 µm or less, and
    a sum of thicknesses of the first portion, the second portion, and the coating layer is about 3 µm or more and about 10 µm or less.

10. The display device of claim 7, wherein the coating layer comprises at least one of silicon oxide, nitric oxide, metal, and metallic oxide.

11. The display device of claim 7, wherein the first portion of the sealing member contacts a bottom surface of the coating layer, and
    a pattern is defined in a contact area of the bottom surface of the coating layer which contacts the sealing member.

12. The display device of claim 1, wherein the encapsulation substrate comprises glass.

13. The display device of claim 1, wherein a contact surface between the first portion and the encapsulation substrate has a width of about 300 µm or more and about 700 µm or less.

14. A display device comprising:
    a display substrate comprising a base substrate including a display area and a non-display area, a voltage supply electrode on the non-display area, a light emitting element electrically connected to the voltage supply electrode and located on the display area, and an organic spacer overlapping the voltage supply electrode, the organic spacer comprising an outer surface facing away from the display area;
    an encapsulation substrate over the display substrate; and
    a sealing member coupling the display substrate and the encapsulation substrate,
    wherein the sealing member comprises:
    a first portion between the display substrate and the encapsulation substrate, the first portion overlapping the organic spacer and comprising a side surface that is aligned with a side surface of the display substrate in a plan view as viewed along a thickness direction of the display substrate; and a second portion between the first portion and the display substrate and comprising a first side surface aligned with the side surface of the display substrate in the plan view and a second side surface opposite the first side surface and spaced apart from the organic spacer, wherein the first portion and the second portion define an interface, wherein the sealing member is spaced from the outer surface of the organic spacer so as to define a gap therebetween along an outward direction extending from the display area toward the non-display area, wherein the second portion comprises a material having an elastic modulus less than that of a material of the first portion, and the first portion is adjacent to the encapsulation substrate, and the second portion is spaced apart from the encapsulation substrate.

* * * * *